United States Patent
Masuda et al.

(10) Patent No.: US 10,748,947 B2
(45) Date of Patent: Aug. 18, 2020

(54) IMAGING DEVICE, MANUFACTURING METHOD, AND ELECTRONIC APPARATUS

(71) Applicant: SONY SEMICONDUCTOR SOLUTIONS CORPORATION, Kanagawa (JP)

(72) Inventors: Yoshiaki Masuda, Kanagawa (JP); Atsuhiro Ando, Kanagawa (JP); Norihiro Kubo, Kanagawa (JP); Chihiro Arai, Kanagawa (JP); Sotetsu Saito, Tokyo (JP); Masahiro Tada, Kanagawa (JP); Shinji Miyazawa, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 15 days.

(21) Appl. No.: 16/322,307

(22) PCT Filed: Jul. 25, 2017

(86) PCT No.: PCT/JP2017/026768
§ 371 (c)(1),
(2) Date: Jan. 31, 2019

(87) PCT Pub. No.: WO2018/030140
PCT Pub. Date: Feb. 15, 2018

(65) Prior Publication Data
US 2019/0172863 A1 Jun. 6, 2019

(30) Foreign Application Priority Data
Aug. 8, 2016 (JP) .................................. 2016-155293

(51) Int. Cl.
*H01L 31/0203* (2014.01)
*H01L 27/146* (2006.01)
(Continued)

(52) U.S. Cl.
CPC ........ *H01L 27/14618* (2013.01); *H01L 23/10* (2013.01); *H01L 23/29* (2013.01);
(Continued)

(58) Field of Classification Search
CPC combination set(s) only.
See application file for complete search history.

(56) References Cited

U.S. PATENT DOCUMENTS

| 2009/0085139 A1 | 4/2009 | Takeuchi et al. |
| 2010/0025791 A1 | 2/2010 | Ogawa et al. |
| 2016/0340561 A1 | 11/2016 | Ikeda et al. |

FOREIGN PATENT DOCUMENTS

| JP | H07-135302 | 5/1995 |
| JP | 2002-009205 | 1/2002 |

(Continued)

OTHER PUBLICATIONS

International Search Report prepared by the Japan Patent Office dated Oct. 10, 2017, for International Application No. PCT/JP2017/026768.

*Primary Examiner* — Robert G Bachner
(74) *Attorney, Agent, or Firm* — Sheridan Ross P.C.

(57) ABSTRACT

The present disclosure relates to an imaging device, a manufacturing method, and an electronic apparatus. An imaging device includes: a sensor substrate with an effective pixel area; a transparent sealing member that seals a surface of the sensor substrate; a sealing resin that bonds the sensor substrate and the sealing member; and a reinforcing resin that bonds the sensor substrate and the sealing member. A product of adhesive strength per unit area of the sealing resin and the reinforcing resin in the outer peripheral region and an area of a part bonded in the outer peripheral region is set to be larger than a product of adhesive strength per unit area of the sealing resin in the effective pixel area and an area of (Continued)

a part bonded in the effective pixel area. The present technology can be applied to, for example, a CMOS image sensor of WCSP.

18 Claims, 29 Drawing Sheets

(51) Int. Cl.
*H01L 23/10* (2006.01)
*H01L 23/31* (2006.01)
*H01L 23/29* (2006.01)
*H04N 5/369* (2011.01)

(52) U.S. Cl.
CPC ........ *H01L 23/31* (2013.01); *H01L 27/14683* (2013.01); *H01L 27/14687* (2013.01); *H04N 5/369* (2013.01)

(56) References Cited

FOREIGN PATENT DOCUMENTS

| | | |
|---|---|---|
| JP | 2003-298890 | 10/2003 |
| JP | 2004-194204 | 7/2004 |
| JP | 2008-219854 | 9/2008 |
| JP | 2009-088407 | 4/2009 |
| JP | 2010-040621 | 2/2010 |
| JP | 2010-205773 | 9/2010 |
| JP | 2012-049335 | 3/2012 |
| WO | WO 2013/179766 | 12/2013 |
| WO | WO 2015/115553 | 8/2015 |

US 10,748,947 B2

IMAGING DEVICE, MANUFACTURING METHOD, AND ELECTRONIC APPARATUS

CROSS REFERENCE TO RELATED APPLICATIONS

This application is a national stage application under 35 U.S.C. 371 and claims the benefit of PCT Application No. PCT/JP2017/026768 having an international filing date of 25 Jul. 2017, which designated the United States, which PCT application claimed the benefit of Japanese Patent Application No. 2016-155293 filed 8 Aug. 2016, the entire disclosures of each of which are incorporated herein by reference.

TECHNICAL FIELD

The present disclosure relates to an imaging device, a manufacturing method, and an electronic apparatus, and particularly, to an imaging device, a manufacturing method, and an electronic apparatus capable of achieving better characteristics.

BACKGROUND ART

The wafer level chip size package (WCSP) has been established as one of conventional techniques for manufacturing solid-state imaging devices. In WCSP, wafers are cut after formation of terminals, wiring, and the like. Furthermore, when a solid-state imaging device is manufactured by WCSP, a process of bonding a silicon substrate and a glass substrate is performed. In the process, it has been necessary to properly form a bonded structure.

For example, Patent Document 1 discloses an optical device having a structure in which, for the purpose of improving moisture resistance, a transparent member smaller than a solid-state imaging device is bonded to a light receiving surface side of the solid-state imaging device via a transparent adhesive, and the outermost periphery of the transparent adhesive and the transparent member are sealed with a sealing resin.

In addition, Patent Document 2 discloses an image pickup apparatus with the following structure. For the purpose of improving moisture resistance, a glass wafer larger than an imaging chip is bonded to a light receiving surface side of the imaging chip via an adhesive, and the outermost periphery of the imaging chip and the adhesive are sealed with a sealing member.

CITATION LIST

Patent Document

Patent Document 1: Japanese Patent Application Laid-Open No. 2008-219854
Patent Document 2: WO 13/179766 A

SUMMARY OF THE INVENTION

Problems to be Solved by the Invention

Incidentally, as disclosed in Patent Documents 1 and 2, various conventional techniques have been developed with regard to a configuration in which a silicon substrate and a glass substrate are bonded. Meanwhile, there is a demand for development of a technique capable of further improvement in characteristics.

The present disclosure has been made in view of such circumstances, and is intended to enable better characteristics to be achieved.

Solutions to Problems

An imaging device according to one aspect of the present disclosure includes: a sensor substrate provided with an effective pixel area in which a plurality of pixels is arranged in an array; a transparent sealing member that seals a surface of the sensor substrate on the effective pixel area side; a first adhesive member that bonds the sensor substrate and the sealing member in an area including at least the effective pixel area; and a second adhesive member that bonds the sensor substrate and the sealing member in an outer peripheral region located outside the effective pixel area in a planar view, and has higher rigidity than the first adhesive member, in which a product of adhesive strength per unit area of the first adhesive member and the second adhesive member in the outer peripheral region and an area of a part bonded in the outer peripheral region is set to be larger than a product of adhesive strength per unit area of the first adhesive member in the effective pixel area and an area of a part bonded in the effective pixel area.

A manufacturing method according to one aspect of the present disclosure is a method of manufacturing an imaging device that includes: a sensor substrate provided with an effective pixel area in which a plurality of pixels is arranged in an array; a transparent sealing member that seals a surface of the sensor substrate on the effective pixel area side; a first adhesive member that bonds the sensor substrate and the sealing member in an area including at least the effective pixel area; and a second adhesive member that bonds the sensor substrate and the sealing member in an outer peripheral region located outside the effective pixel area in a planar view, and has higher rigidity than the first adhesive member, in which a product of adhesive strength per unit area of the first adhesive member and the second adhesive member in the outer peripheral region and an area of a part bonded in the outer peripheral region is set to be larger than a product of adhesive strength per unit area of the first adhesive member in the effective pixel area and an area of a part bonded in the effective pixel area. Then, the method includes: forming the second adhesive member with a discontinuous part in the outer peripheral region of either the sensor substrate or the sealing member; forming the first adhesive member on an entire surface except an area in which the second adhesive member has been formed; and bonding the sensor substrate and the sealing member with the first adhesive member and the second adhesive member. Alternatively, the method includes: forming the second adhesive member, at a wafer level before the imaging device is divided into individual pieces, such that the second adhesive member is disposed in the outer peripheral region except portions at which chip edges of the imaging device are to be formed; forming the first adhesive member on a surface except an area in which the second adhesive member has been formed; bonding the sensor substrate and the sealing member with the first adhesive member and the second adhesive member; and performing dicing at the portions at which chip edges of the imaging device are to be formed.

An electronic apparatus according to one aspect of the present disclosure includes an imaging device that includes: a sensor substrate provided with an effective pixel area in which a plurality of pixels is arranged in an array; a transparent sealing member that seals a surface of the sensor substrate on the effective pixel area side; a first adhesive member that bonds the sensor substrate and the sealing member in an area including at least the effective pixel area; and a second adhesive member that bonds the sensor substrate and the sealing member in an outer peripheral region located outside the effective pixel area in a planar view, and has higher rigidity than the first adhesive member, in which a product of adhesive strength per unit area of the first adhesive member and the second adhesive member in the outer peripheral region and an area of a part bonded in the outer peripheral region is set to be larger than a product of adhesive strength per unit area of the first adhesive member in the effective pixel area and an area of a part bonded in the effective pixel area.

In one aspect of the present disclosure, there are included: a sensor substrate provided with an effective pixel area in which a plurality of pixels is arranged in an array; a transparent sealing member that seals a surface of the sensor substrate on the effective pixel area side; a first adhesive member that bonds the sensor substrate and the sealing member in an area including at least the effective pixel area; and a second adhesive member that bonds the sensor substrate and the sealing member in an outer peripheral region located outside the effective pixel area in a planar view, and has higher rigidity than the first adhesive member. Then, a product of adhesive strength per unit area of the first adhesive member and the second adhesive member in the outer peripheral region and an area of a part bonded in the outer peripheral region is set to be larger than a product of adhesive strength per unit area of the first adhesive member in the effective pixel area and an area of a part bonded in the effective pixel area.

Effects of the Invention

According to one aspect of the present disclosure, it is possible to achieve better characteristics.

MODE FOR CARRYING OUT THE INVENTION

Specific embodiments to which the present technology has been applied will be described below in detail with reference to the drawings.

<First Configuration Example of Imaging Device>

Figure 1:
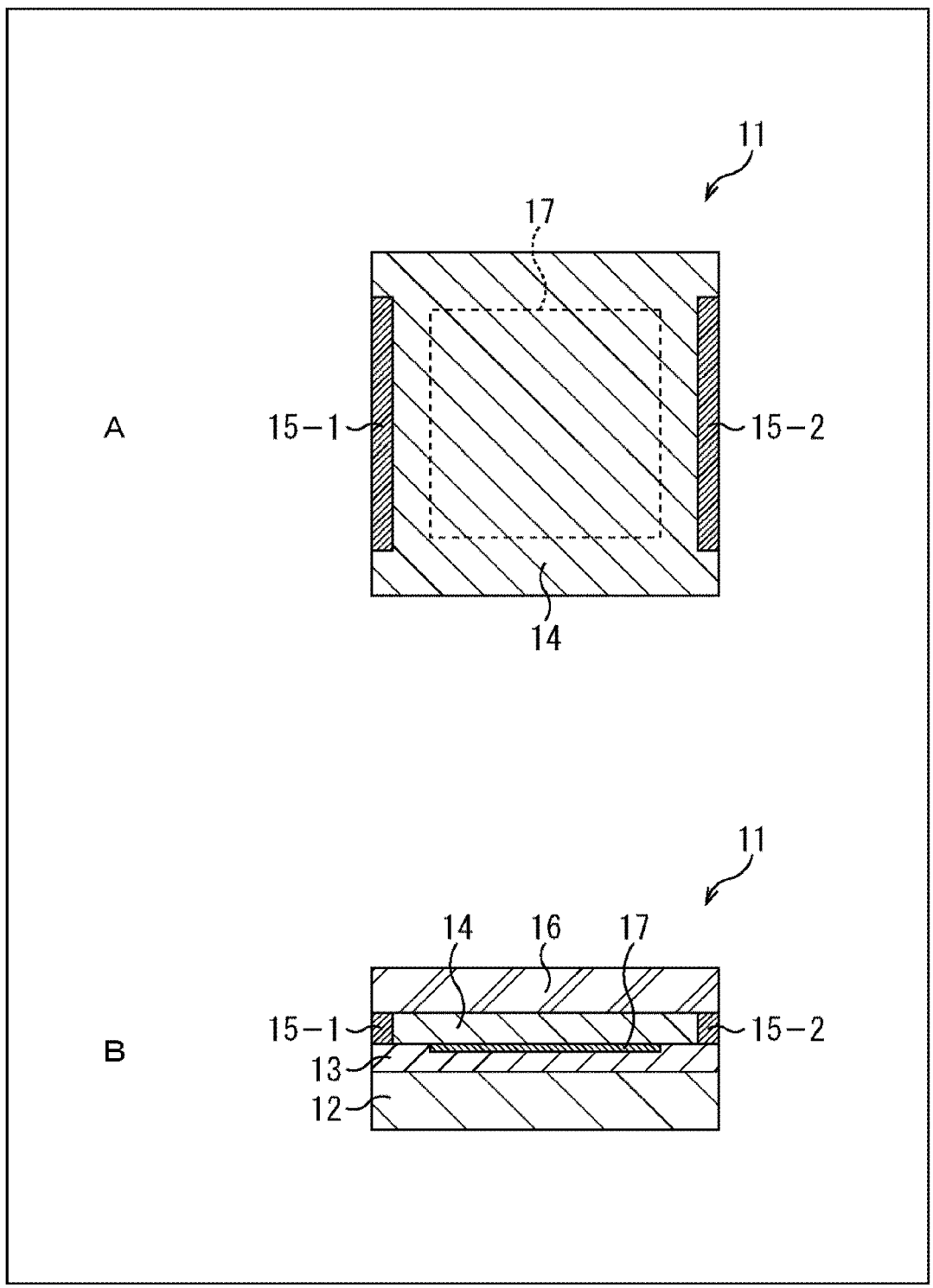
FIG. 1 is a diagram showing a configuration example of a first embodiment of an imaging device to which the present technology has been applied.

FIG. 1 is a diagram showing a configuration example of a first embodiment of an imaging device to which the present technology has been applied. A plan view of a configuration example of an imaging device 11 is shown in A of FIG. 1, and a cross-sectional view of the configuration example of the imaging device 11 is shown in B of FIG. 1.

As shown in B of FIG. 1, the imaging device 11 includes, in order from bottom, a supporting substrate 12; a sensor substrate 13; a sealing resin 14 and a reinforcing resin 15; and a sealing glass 16, which are stacked in layers. For example, the imaging device 11 is a back-illuminated complementary metal oxide semiconductor (CMOS) image sensor, in which an effective pixel area 17 is irradiated with light. The effective pixel area 17 is provided on a back surface (a surface on the upper side in B of FIG. 1) facing a side opposite to a surface of a semiconductor layer included in the sensor substrate 13.

The supporting substrate 12 is bonded to a surface of the sensor substrate 13 processed to form a thin film on the back side, and supports the sensor substrate 13. For example, a signal processing circuit that processes pixel signals output from the sensor substrate 13 may be formed on the supporting substrate 12.

Pixels that include photodiodes, transistors, and the like are formed on the sensor substrate 13, and a plurality of the pixels is arranged in an array in the effective pixel area 17. For example, the effective pixel area 17 of the sensor substrate 13 is an area in which there are arranged effective pixels to be used for constructing an image when the image is taken by the imaging device 11.

The sealing resin 14 is an adhesive member for bonding the sensor substrate 13 and the sealing glass 16 in an area including at least the effective pixel area 17. For example, a resin material is selected for the sealing resin 14 with priority given to optical characteristics (a refractive index, an extinction coefficient, and the like) so that the effective pixel area 17 can satisfactorily receive light incident on the imaging device 11.

The reinforcing resin 15 is an adhesive member for bonding the sensor substrate 13 and the sealing glass 16 in an outer region located outside the effective pixel area 17 in a planar view of the imaging device 11 as shown in A of FIG. 1. For example, a resin material with higher rigidity than that of the sealing resin 14 is selected for the reinforcing resin 15 so as to reinforce bonding strength of the sensor substrate 13 and the sealing glass 16.

Here, the outer region is a region which is located outside the effective pixel area 17, and extends to include chip edges of the imaging device 11. Then, as shown in A of FIG. 1, the reinforcing resins 15-1 and 15-2 are disposed in an area including the chip edges of the imaging device 11, in the outer region, and are formed with discontinuous parts. That is, as shown in the drawing, the reinforcing resins 15-1 and 15-2-2 are formed separately (so as not to be continuous) along two opposed sides in a planar view of the imaging device 11.

Note that, for example, a siloxane-based resin, an acrylic-based resin, or an epoxy-based resin can be used as the sealing resin 14 and the reinforcing resin 15. Alternatively, it is possible to adopt a configuration in which, instead of using a resin derived from an organic material, an inorganic film of silicon oxide (SiO), silicon nitride (SiN), or the like is used as the sealing resin 14 and the reinforcing resin 15 to bond the sensor substrate 13 and the sealing glass 16. Furthermore, in this case, only the sealing resin 14 may be replaced with an inorganic film, or only the reinforcing resin 15 may be replaced with an inorganic film. Alternatively, both of the sealing resin 14 and the reinforcing resin 15 may be replaced with inorganic films.

The sealing glass 16 is a transparent member for sealing and hermetically molding the effective pixel area 17 of the sensor substrate 13. Note that a member that transmits light may be used as the sealing glass 16, and it is also possible to adopt a transparent material other than glass, as a sealing member.

In the imaging device 11 configured as described above, the sealing resin 14 and the reinforcing resins 15-1 and 15-2 are formed such that the product of the adhesive strength per unit area of the sealing resin 14 and the reinforcing resins 15-1 and 15-2 in an outer peripheral region and the area of a bonded part in the outer peripheral region is set to be larger than the product of the adhesive strength per unit area of the sealing resin 14 in the effective pixel area 17 and the area of a bonded part in the effective pixel area 17. As a result, it is possible to satisfactorily bond the sensor substrate 13 and the sealing glass 16 with the sealing resin 14 and the reinforcing resins 15-1 and 15-2, in the imaging device 11.

Furthermore, in the imaging device 11, it is possible to eliminate a trade-off between characteristics of the sealing resin 14 and those of the reinforcing resin 15, and to facilitate selection of their respective resin materials, by selecting a resin material as the sealing resin 14 with priority given to optical characteristics, and by selecting a resin material as the reinforcing resin 15 with priority given to peeling resistance strength. Then, with selection performed in such a manner, it is possible to cause the effective pixel area 17 of the sensor substrate 13 to satisfactorily receive light, and is also possible to surely prevent the sealing glass 16 from peeling from the sensor substrate 13. In other words, it is possible to allow the imaging device 11 to have better characteristics than conventional ones in terms of light receiving characteristics and peeling characteristics. As a result, the imaging device 11 achieves higher imaging capability and reliability.

Furthermore, the imaging device 11 includes the reinforcing resins 15-1 and 15-2 formed discontinuously. Thus, it is possible to reduce unevenness in application of the sealing resin 14, as compared with a configuration in which, for example, the reinforcing resin 15 is continuously formed. As a result, the characteristics of the imaging device 11 can be further improved.

For example, in the configuration in which the reinforcing resin 15 is continuously formed, there is a concern that unevenness in the shape of the sealing resin 14 occurs in such a manner to form a convex shape or a concave shape in an area surrounded by the reinforcing resin 15, resulting in a void defect to deteriorate a yield. In contrast, the imaging device 11 can avoid causing the sealing resin 14 to be in a convex shape or a concave shape, and thus can increase a yield.

Moreover, the reinforcing resins 15-1 and 15-2, which have been formed discontinuously, allows the imaging device 11 to have a structure capable of easily draining water having entered inside during, for example, a manufacturing process. Thus, it is possible to improve resistance to dew condensation.

A first method of manufacturing the imaging device 11 will be described with reference to FIG. 2.

In a first step, a resin material to be the reinforcing resin 15 is applied to an entire surface of the sensor substrate 13 on the effective pixel area 17 side.

In a second step, the reinforcing resins 15-1 and 15-2 are patterned in a manner to be discontinuous in the outer region of the imaging device 11. In other words, photoresist is applied to the resin material applied to the entire surface of the sensor substrate 13. Alternatively, application of photoresist and dry etching are performed. Thus, unnecessary portions of the resin material are removed to form the reinforcing resins 15-1 and 15-2.

In a third step, a resin material to be the sealing resin 14 is applied to an entire surface of the effective pixel area 17 of the sensor substrate 13 except the portions where the reinforcing resins 15-1 and 15-2 have been formed. At this time, the resin material to be the sealing resin 14 is applied in a small amount. Thereafter, chemical mechanical polishing (CMP) is performed. Thus, surfaces of the sealing resin 14 and the reinforcing resins 15-1 and 15-2 are leveled.

Then, the sealing glass 16 is stuck to the sealing resin 14 and the reinforcing resins 15-1 and 15-2. As a result, the sensor substrate 13 and the sealing glass 16 are bonded to each other to form the imaging device 11 as shown in FIG. 1.

In this manner, it is possible to manufacture the imaging device 11 by performing a manufacturing process that includes applying the sealing resin 14 after forming the reinforcing resins 15-1 and 15-2, and bonding the sensor substrate 13 and the sealing glass 16 with the sealing resin 14 and the reinforcing resins 15-1 and 15-2.

Figure 2:
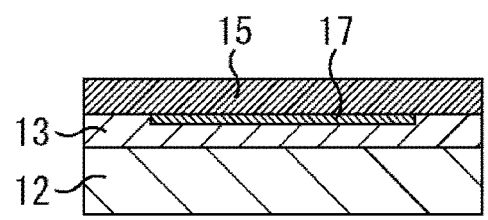
FIG. 2 is a diagram for describing a first method of manufacturing the imaging device.
Figure 2:
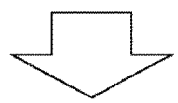
Figure 2:
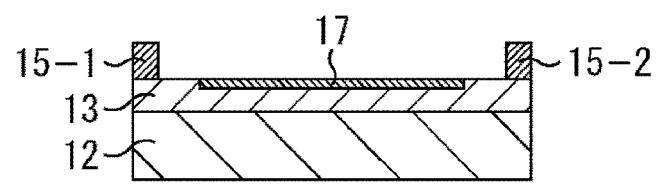
Figure 2:
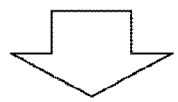
Figure 2:
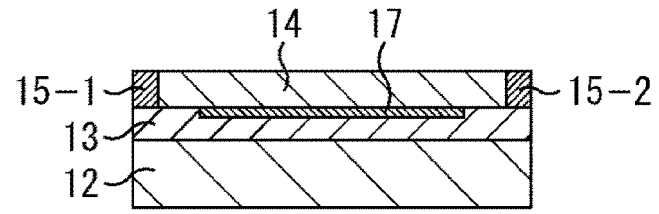

Note that with reference to FIG. 2, a manufacturing process has been described in which the sealing resin 14 and the reinforcing resin 15 are applied to the sensor substrate 13 to bond the sealing glass 16 thereto. Meanwhile, for example, the sealing resin 14 and the reinforcing resin 15 may be applied to the sealing glass 16 to bond the sensor substrate 13 thereto.

Moreover, the configuration of the imaging device 11 is not limited to that shown in FIG. 1 as long as the reinforcing resin 15 is not continuously formed along the outer periphery of the chip of the imaging device 11, that is, as long as the reinforcing resin 15 is discontinuously formed.

Variations of the imaging device 11 will be described with reference to FIG. 3. A first variation of the imaging device 11 is shown in A of FIG. 3, and a second variation of the imaging device 11 is shown in B of FIG. 3.

Figure 3:
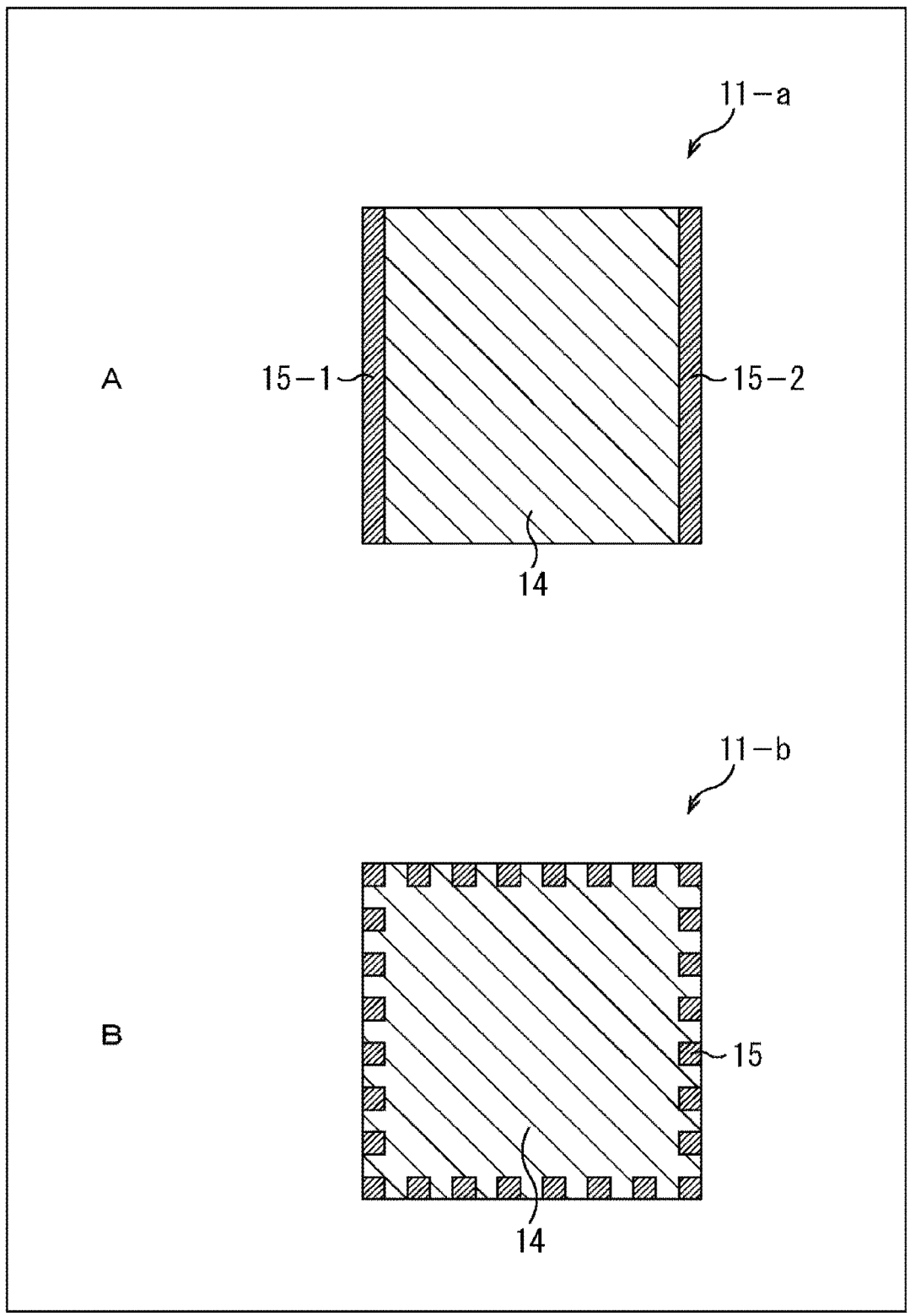
FIG. 3 is a diagram showing variations of the imaging device.

As shown in A of FIG. 3, an imaging device 11-a includes reinforcing resins 15-1 and 15-2 formed along two opposed sides of a chip of the imaging device 11-a, over the entire two sides, in an area including chip edges in an outer peripheral region of the imaging device 11-a. That is, in the imaging device 11 shown in FIG. 1, the reinforcing resins 15-1 and 15-2 are formed in central regions of the two opposed sides of the chip of the imaging device 11-a. Meanwhile, in the imaging device 11-a, the reinforcing resins 15-1 and 15-2 are formed over the entire two sides.

As shown in B of FIG. 3, in an imaging device 11-b, a plurality of reinforcing resins 15 is formed in a scattered manner along an outer periphery of a chip of the imaging device 11-b, in an area including chip edges in an outer peripheral region of the imaging device 11-b.

In the imaging device 11-a and the imaging device 11-b with such configurations, the reinforcing resins 15 are discontinuously formed in the outer peripheral regions. Thus, the imaging device 11-a and the imaging device 11-b can achieve better characteristics, as with the imaging device 11 shown in FIG. 1. Furthermore, the adhesive strength and the area of parts bonded by a sealing resin 14 and the reinforcing resin 15 are also set in the imaging device 11-a and the imaging device 11-b in a manner similar to that of the imaging device 11 shown in FIG. Thus, it is possible to satisfactorily bond a sensor substrate 13 and a sealing glass 16.

A second method of manufacturing the imaging device 11 will be described with reference to FIG. 4.

Figure 4:
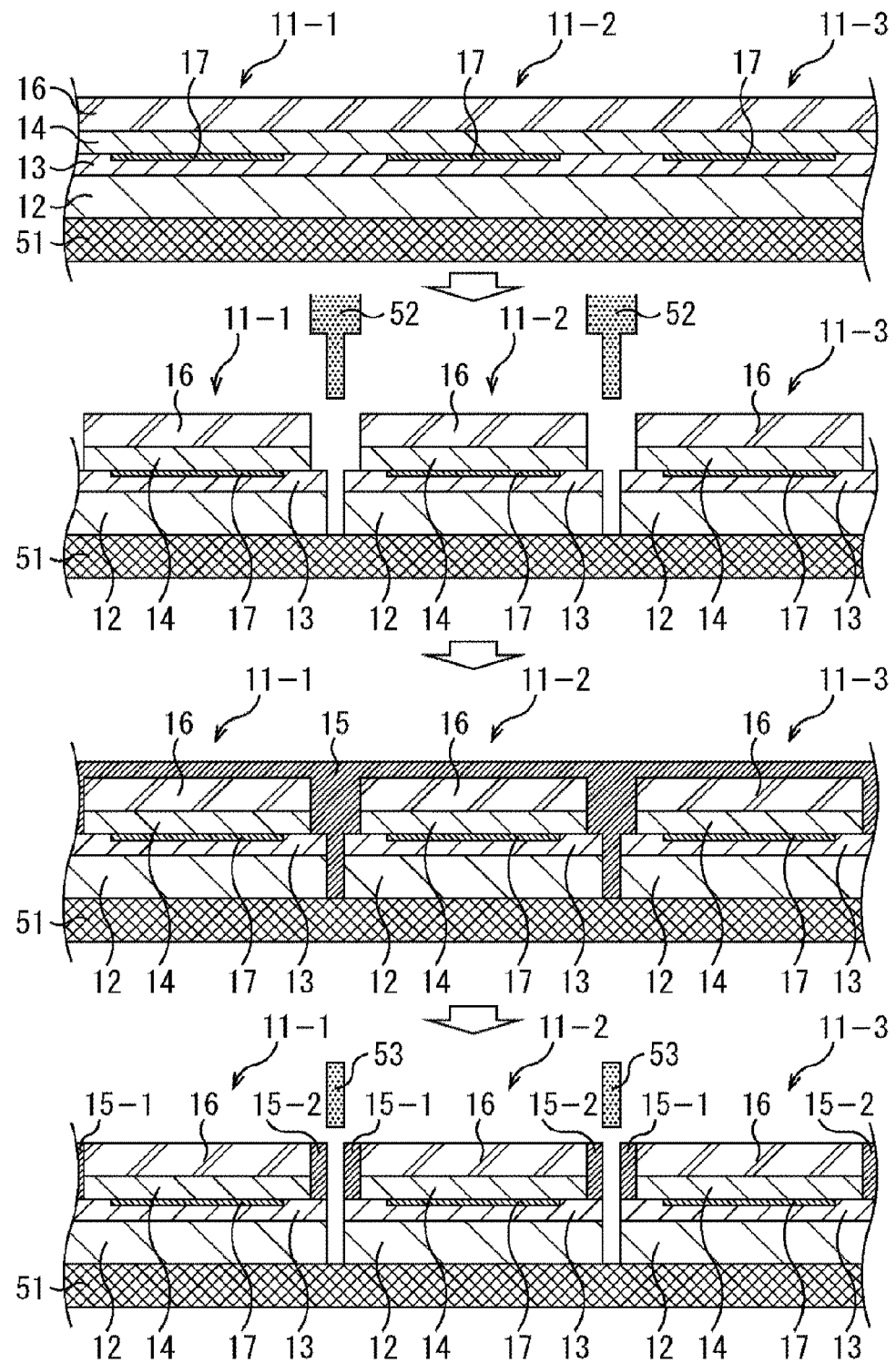
FIG. 4 is a diagram for describing a second method of manufacturing the imaging device.

In a first step, at a wafer level before a wafer is diced into a plurality of imaging devices 11, that is, at a wafer level before a wafer is diced into three imaging devices 11-1 to 11-3 in an example shown in FIG. 4, a side of the wafer, where the supporting substrate 12 exists, is stuck to an adhesive sheet 51. Furthermore, as shown in the drawing, at a wafer level before the wafer is diced, the imaging devices 11-1 to 11-3 include the supporting substrate 12, the sensor substrate 13, the sealing resin 14, and the sealing glass 16 such that they are stacked in layers, each of which is a continuous layer.

In a second step, a slit is formed between each adjacent two of the imaging devices 11-1 to 11-3 by a dicing blade 52 formed in a stepped shape. In this case, there is used, as the dicing blade 52, a dicing blade having a shape which enables a slit to be formed in such a manner that the distance between the adjacent imaging devices 11 is larger at the sealing resins 14 and the sealing glasses 16 than that at the supporting substrates 12 and the sensor substrates 13. Therefore, in the imaging devices 11-1 to 11-3, the slits are formed between the imaging devices 11-1 to 11-3 in such a shape that the widths of the sealing resins 14 and the sealing glasses 16 are smaller than the widths of the supporting substrates 12 and the sensor substrates 13.

In a third step, a resin material to be the reinforcing resin 15 is applied to an entire surface, and the slits formed between the imaging devices 11-1 to 11-3 are also filled with the resin material to be the reinforcing resin 15.

In a fourth step, the wafer is diced to form each of the imaging devices 11-1 to 11-3 by a dicing blade 53. In this case, there is used, as the dicing blade 53, a dicing blade having a shape with a width corresponding to the distance between the adjacent imaging devices 11 at the supporting substrates 12 and the sensor substrates 13. Therefore, in each of the imaging devices 11-1 to 11-3, the resin material is not removed from side surfaces of the sealing resin 14 and the sealing glass 16, and the reinforcing resins 15-1 and 15-2 are thus formed. In other words, the reinforcing resins 15-1 and 15-2 are formed on both side surfaces of the sealing resin 14 and the sealing glass 16 such that the reinforcing resins 15-1 and 15-2 are along the two opposed sides of the chip in a planar view of the imaging device 11 as shown in A of FIG. 3.

Then, the resin material having remained on the surfaces of the imaging devices 11-1 to 11-3 is removed by dry etching or CMP, and the imaging devices 11-1 to 11-3 are picked up from the adhesive sheet 51.

As described above, it is possible to manufacture the imaging device 11 by performing a manufacturing process in which the reinforcing resin 15 is formed before the imaging device 11 is picked up. Furthermore, it is possible to manufacture the imaging device 11 at low cost and with high precision, by manufacturing the imaging device 11 at a wafer level.

Second Configuration Example of Imaging Device

Figure 5:
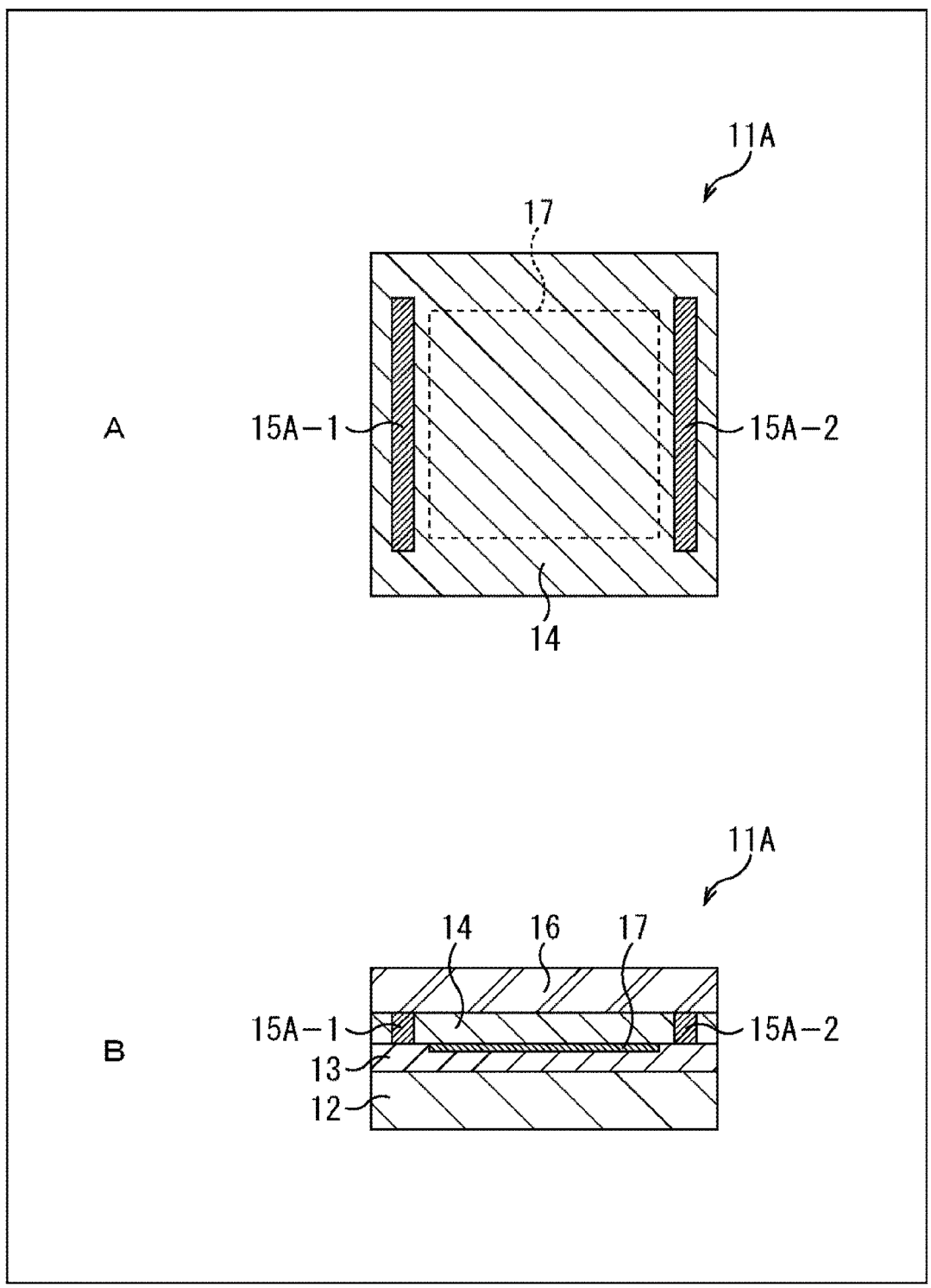
FIG. 5 is a diagram showing a second configuration example of the imaging device.

FIG. 5 is a diagram showing a second configuration example of the imaging device 11. A plan view of a configuration example of an imaging device 11A is shown in A of FIG. 5, and a cross-sectional view of the configuration example of the imaging device 11A is shown in B of FIG. 5. Note that in the imaging device 11A, configurations adopted in common with the imaging device 11 shown in FIG. 1 are denoted by the same reference signs, and detailed descriptions thereof will be omitted.

As shown in B of FIG. 5, the imaging device 11A includes, in order from bottom, a supporting substrate 12; a sensor substrate 13; a sealing resin 14 and a reinforcing resin 15A; and a sealing glass 16, which are stacked in layers, as with the imaging device 11 shown in FIG. 1.

However, as shown in A of FIG. 5, in the imaging device 11A, reinforcing resins 15A-1 and 15A-2 are formed in an area not including chip edges of the imaging device 11A, that is, an area located inside the chip edges of the imaging device 11A. Furthermore, as with the reinforcing resins 15-1 and 15-2 shown in FIG. 1, the reinforcing resins 15A-1 and 15A-2 are formed along two opposed sides of the chip of the imaging device 11A in a manner to be discontinuous.

Thus, it is possible to easily perform, for example, singulation processing in a manufacturing process of the imaging device 11A, by forming the reinforcing resins 15A-1 and 15A-2 in the area not including the chip edges of the imaging device 11A in the above-described manner. In other words, in a case where the reinforcing resin 15 is formed in an area including the chip edges, there is a concern that chipping defects are likely to occur in dicing in a manufacturing process in which an imaging device is manufactured at a wafer level, resulting in a deterioration in a yield.

Meanwhile, in the imaging device 11A, processing is performed on the sealing resin 14, which is lower in rigidity than the reinforcing resin 15A, in dicing in a manufacturing process in which the imaging device 11A is manufactured at a wafer level. Therefore, it is possible to prevent occurrence of chipping defects, and improve a yield. Furthermore, as a result of the above, it is possible to perform processing with higher precision.

Moreover, the adhesive strength and the area of parts bonded by the sealing resin 14 and the reinforcing resin 15A are set also in the imaging device 11A, in a manner similar to that of the imaging device 11 shown in FIG. 1. Thus, it is possible to satisfactorily bond the sensor substrate 13 and the sealing glass 16.

A method of manufacturing the imaging device 11A will be described with reference to FIG. 6.

Figure 6:
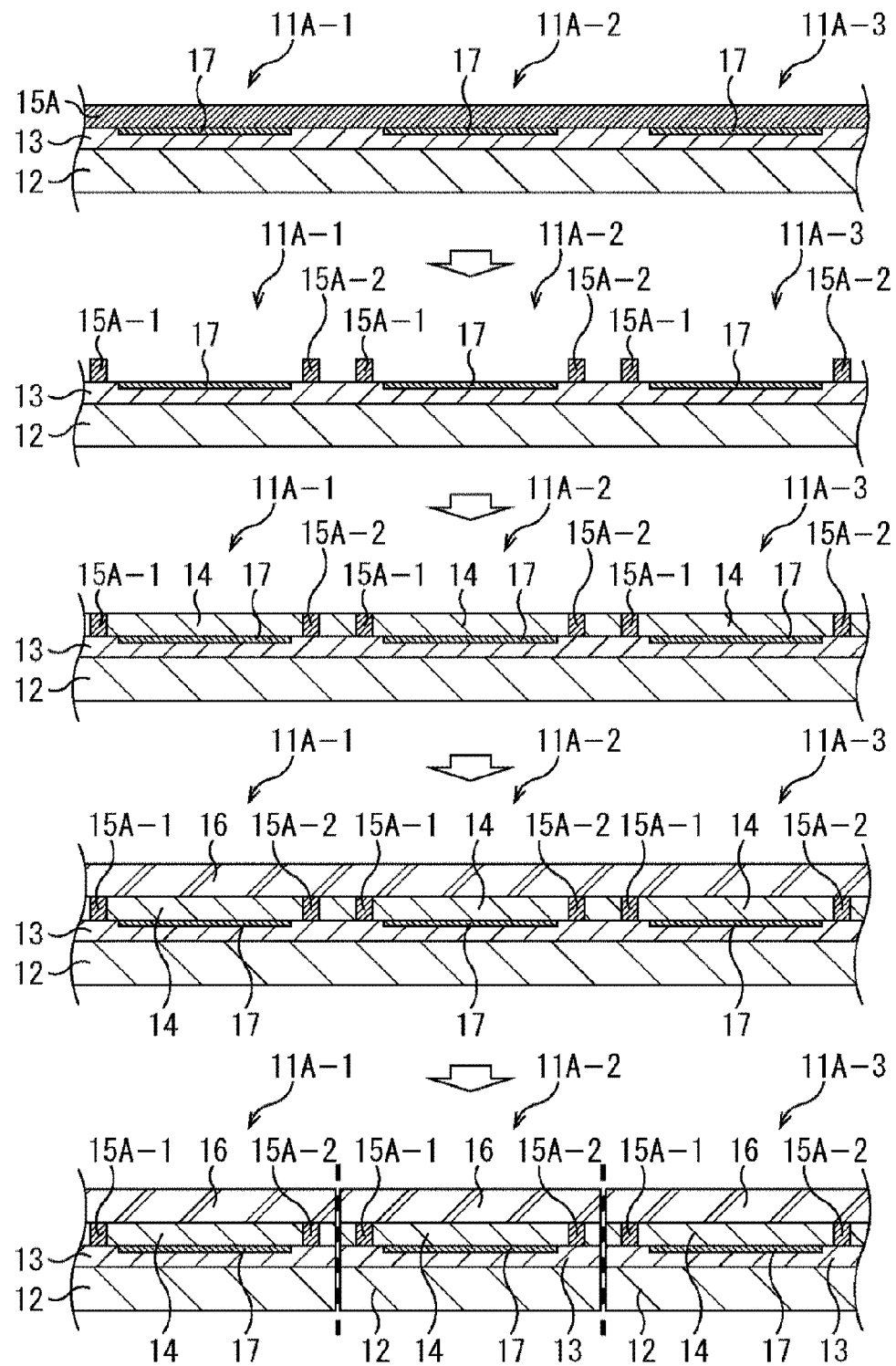
FIG. 6 is a diagram for describing a method of manufacturing the imaging device.

In a first step, at a wafer level before a wafer is diced into a plurality of the imaging devices 11A, that is, at a wafer level before a wafer is diced into three imaging devices 11A-1 to 11A-3 in an example shown in FIG. 6, a resin material to be the reinforcing resin 15A is applied to an entire surface of the sensor substrate 13 of the wafer on the effective pixel area 17 side.

In a second step, the reinforcing resins 15A-1 and 15A-2 are patterned in a manner to be discontinuous in an outer region of the imaging device 11A. In other words, photoresist is applied to the resin material applied to the entire surface of the sensor substrate 13. Alternatively, application of photoresist and dry etching are performed. Thus, unnecessary portions of the resin material are removed to form the reinforcing resins 15A-1 and 15A-2.

In a third step, a resin material to be the sealing resin 14 is applied to entire surfaces of the effective pixel areas 17 of the sensor substrate 13 except the portions where the reinforcing resins 15A-1 and 15A-2 have been formed. At this time, the resin material to be the sealing resin 14 is applied in a small amount. Thereafter, CMP is performed. Thus, surfaces of the sealing resin 14 and the reinforcing resins 15A-1 and 15A-2 are leveled.

In a fourth step, the sealing glass 16 is stuck to the sealing resin 14 and the reinforcing resins 15A-1 and 15A-2 at a wafer level.

In a fifth step, the wafer is diced to form each of the imaging devices 11A-1 to 11A-3 by use of a dicing blade. At this time, in the imaging device 11A, processing is performed not on the reinforcing resins 15A-1 and 15A-2, but on the sealing resin 14, so that the imaging device 11A can be divided into individual pieces.

In this manner, it is possible to manufacture the imaging device 11A by performing a manufacturing process in which the imaging device 11A is divided into individual pieces after forming the sealing resin 14 and the reinforcing resins 15A-1 and 15A-2, at a wafer level, to bond the sensor substrate 13 and the sealing glass 16. Then, it is possible to avoid performing processing on the reinforcing resins 15A-1 and 15A-2 when the imaging device 11A is divided into individual pieces.

Variations of the imaging device 11A will be described with reference to FIG. 7. A first variation of the imaging device 11A is shown in A of FIG. 7, and a second variation of the imaging device 11A is shown in B of FIG. 7.

Figure 7:
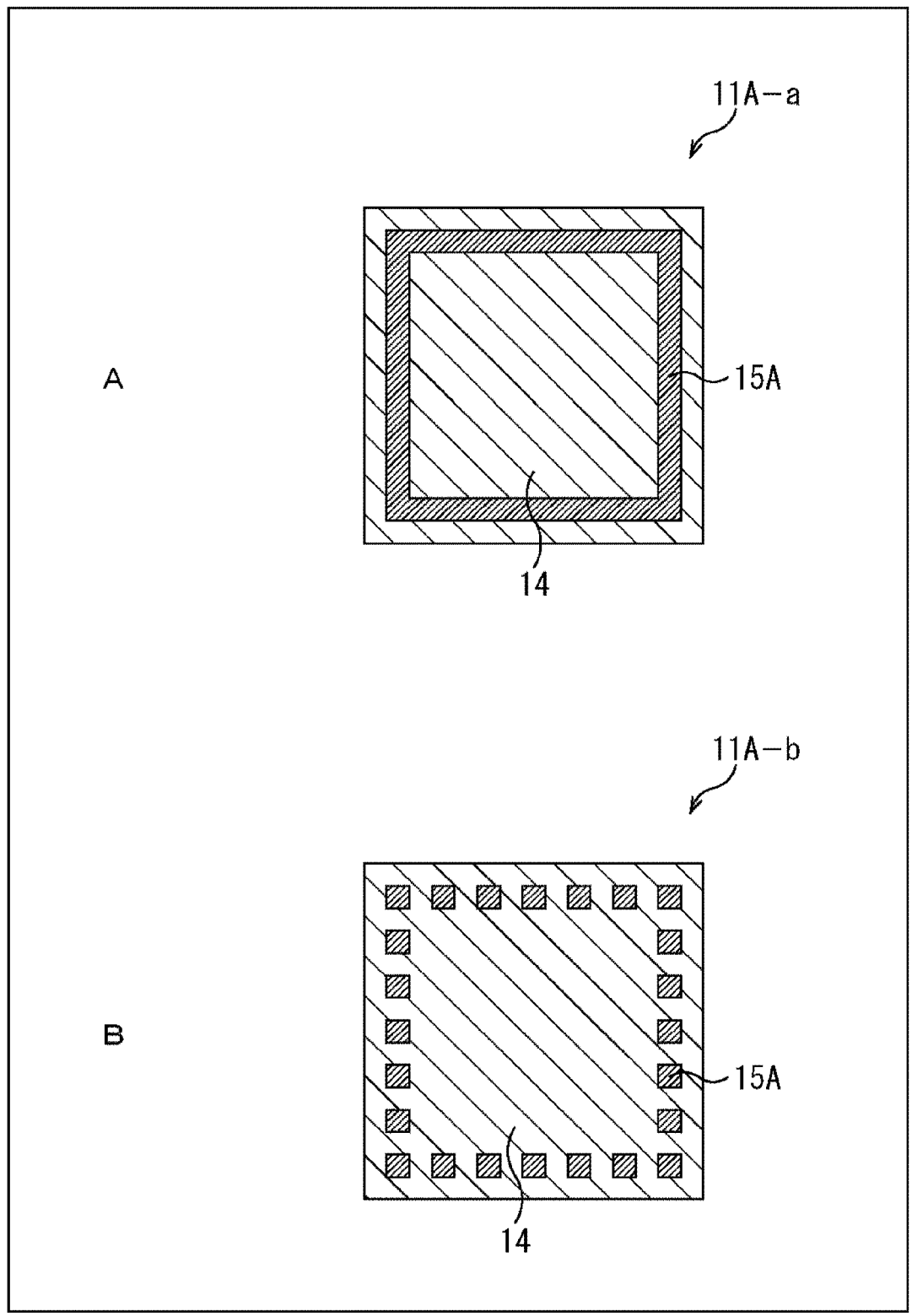
FIG. 7 is a diagram showing variations of the imaging device.

As shown in A of FIG. 7, an imaging device 11A-a includes a reinforcing resin 15A continuously formed in an area including no chip edge in an outer peripheral region of the imaging device 11A-a, in a manner to surround an effective pixel area 17. In other words, the imaging device 11A-a can achieve an effect of easily performing singulation processing as described above in a case of the reinforcing resin 15A being formed in the area including no chip edge in the outer peripheral region of the imaging device 11A-a.

As shown in B of FIG. 7, an imaging device 11A-b includes a plurality of reinforcing resins 15A formed in a scattered manner along an outer periphery of a chip of the imaging device 11A-b in an area including no chip edge in an outer peripheral region of the imaging device 11A-b.

In the imaging device 11A-a and the imaging device 11A-b with such configurations, the reinforcing resins 15 are formed in the areas including no chip edge. Thus, the imaging device 11A-a and the imaging device 11A-b can achieve better characteristics, as with the imaging device 11A shown in FIG. 5. Furthermore, the adhesive strength and the area of parts bonded by the sealing resin 14 and the reinforcing resin 15A are set also in the imaging device 11A-a and the imaging device 11A-b, in a manner similar to that of the imaging device 11A shown in FIG. 5. Thus, it is possible to satisfactorily bond the sensor substrate 13 and the sealing glass 16.

Note that, for example, the imaging device 11 and the imaging device 11A may be formed such that side surfaces thereof have a tapered shape.

Figure 8:
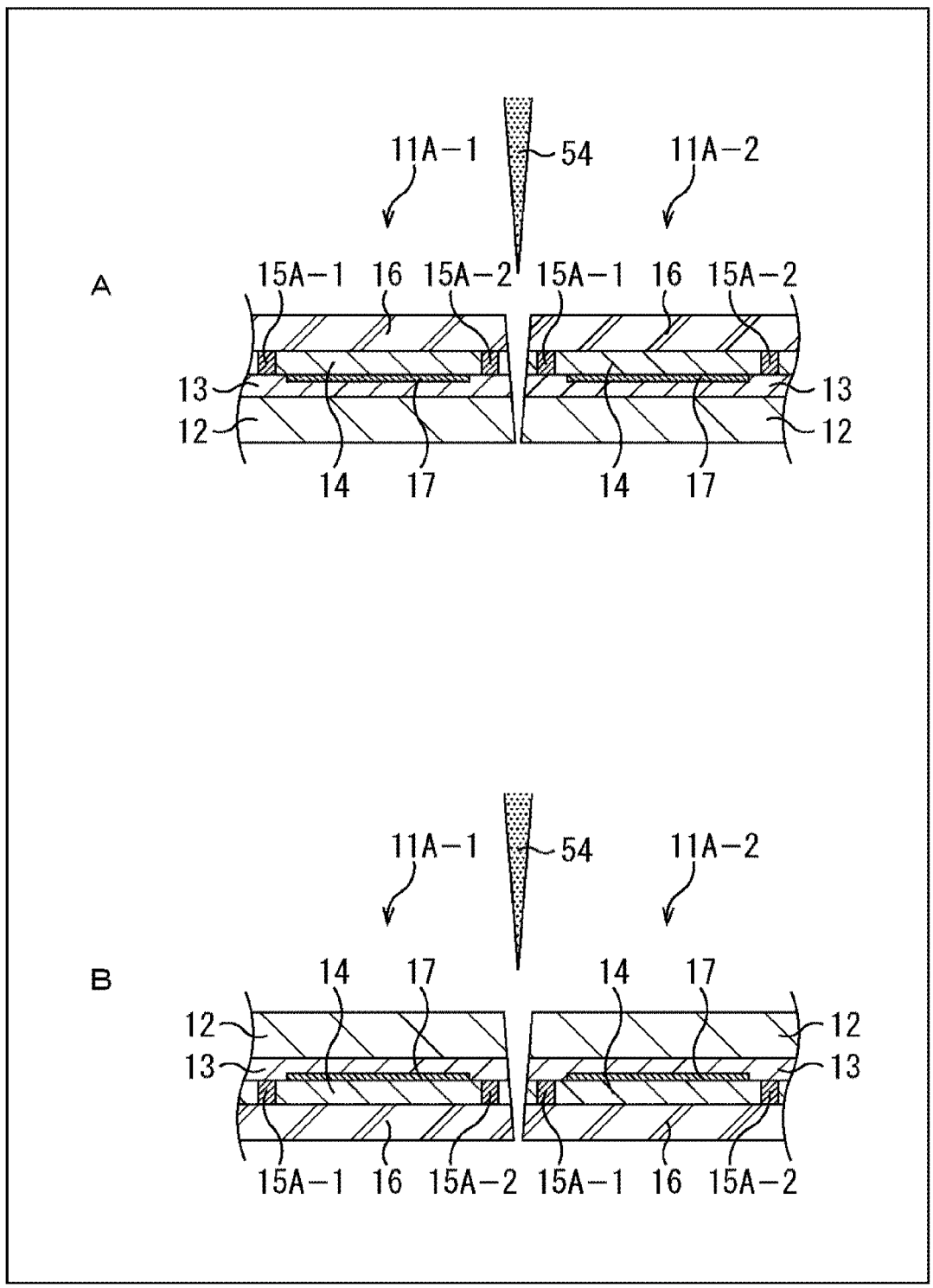
FIG. 8 is a diagram showing imaging devices with side surfaces formed in a tapered shape.

In other words, as shown in FIG. 8, it is possible form the side surface of the imaging device 11A in a tapered shape by using a dicing blade 54 having a shape that tapers toward the tip. For example, A of FIG. 8 shows the imaging device 11A formed in a tapered shape, by dicing with the dicing blade 54 from a light receiving surface side of the imaging device 11A, such that the width of the imaging device 11A decreases toward the light receiving surface thereof. In addition, B of FIG. 8 shows the imaging device 11A formed in a tapered shape, by dicing with the dicing blade 54 from a side opposite to the light receiving surface of the imaging device 11A, such that the width of the imaging device 11A increases toward the light receiving surface thereof.

It is possible to, for example, prevent flare due to light reflected on an end face of the chip, and to achieve miniaturization of a chip set by thus forming the side surface of the imaging device 11A in a tapered shape.

As described above, the above-described imaging device 11 can achieve better characteristics than conventional ones in terms of light receiving characteristics and peeling characteristics. Furthermore, it is possible to easily select materials for the sealing resin 14 and the reinforcing resin 15. In addition, various manufacturing methods can be adopted as described above. Thus, it is possible to improve capabilities of mass production.

Third Configuration Example of Imaging Device

Figure 9:
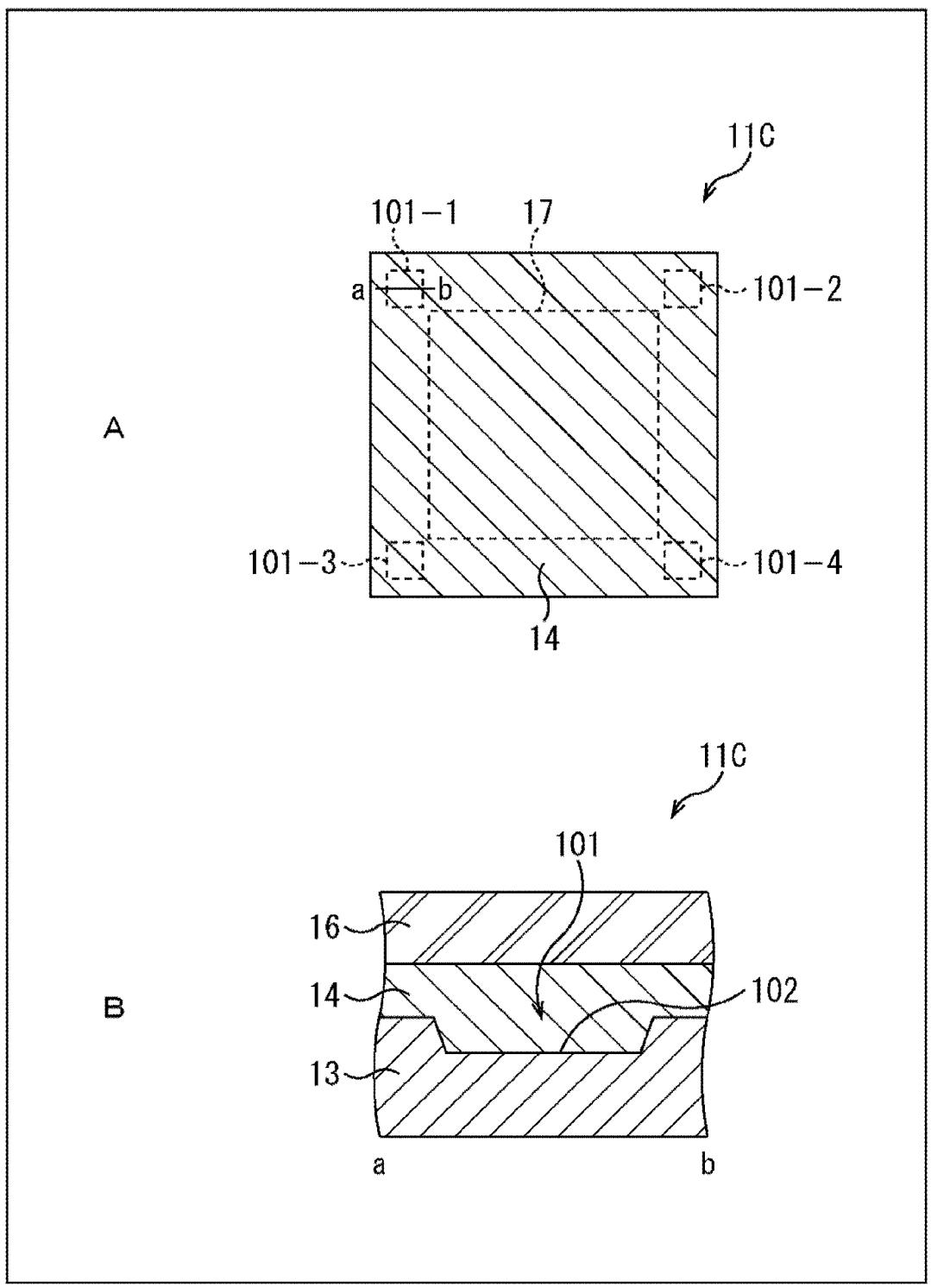
FIG. 9 is a diagram showing a third configuration example of the imaging device.

FIG. 9 is a diagram showing a third configuration example of the imaging device 11. A plan view of a configuration example of an imaging device 11C is shown in A of FIG. 9, and a cross-sectional view taken along a line a-b shown in A of FIG. 9 is shown in B of FIG. 9. Note that in the imaging device 11C shown in FIG. 9, configurations adopted in common with the imaging device 11 shown in FIG. 1 are denoted by the same reference signs, and detailed descriptions thereof will be omitted.

The imaging device 11C includes, in order from bottom, a sensor substrate 13, a sealing resin 14, and a sealing glass 16, which are stacked in layers. Then, as shown in A of FIG. 9, the imaging device 11C includes excavated portions 101-1 to 101-4 formed at four positions in the vicinity of four corners in an outer peripheral region located outside an effective pixel area 17. Note that each of the excavated portions 101-1 to 101-4 is formed with a similar cross-sectional shape, and is thus simply referred to as an excavated portion 101 hereinafter, in a case where there is no need to distinguish among them.

As shown in B of FIG. 9, the excavated portion 101 has a structure in which the sealing resin 14 is embedded in a counterbore portion 102 formed in a manner to excavate the sensor substrate 13.

The imaging device 11C includes the excavated portion 101 provided at a plurality of positions (four positions in the example shown in A of FIG. 9) in the outer peripheral region. This achieves a structure having good resistance to lateral stress on a part at which the sensor substrate 13 and the sealing resin 14 are bonded. It is thus possible to improve shear strength of the part at which the sensor substrate 13 and the sealing resin 14 are bonded.

Note that a structure of the excavated portion 101 is not limited to the structure in which the sensor substrate 13 is provided with the counterbore portion 102 as shown in FIG. 9, and it is also possible to adopt another structure.

Figure 10:
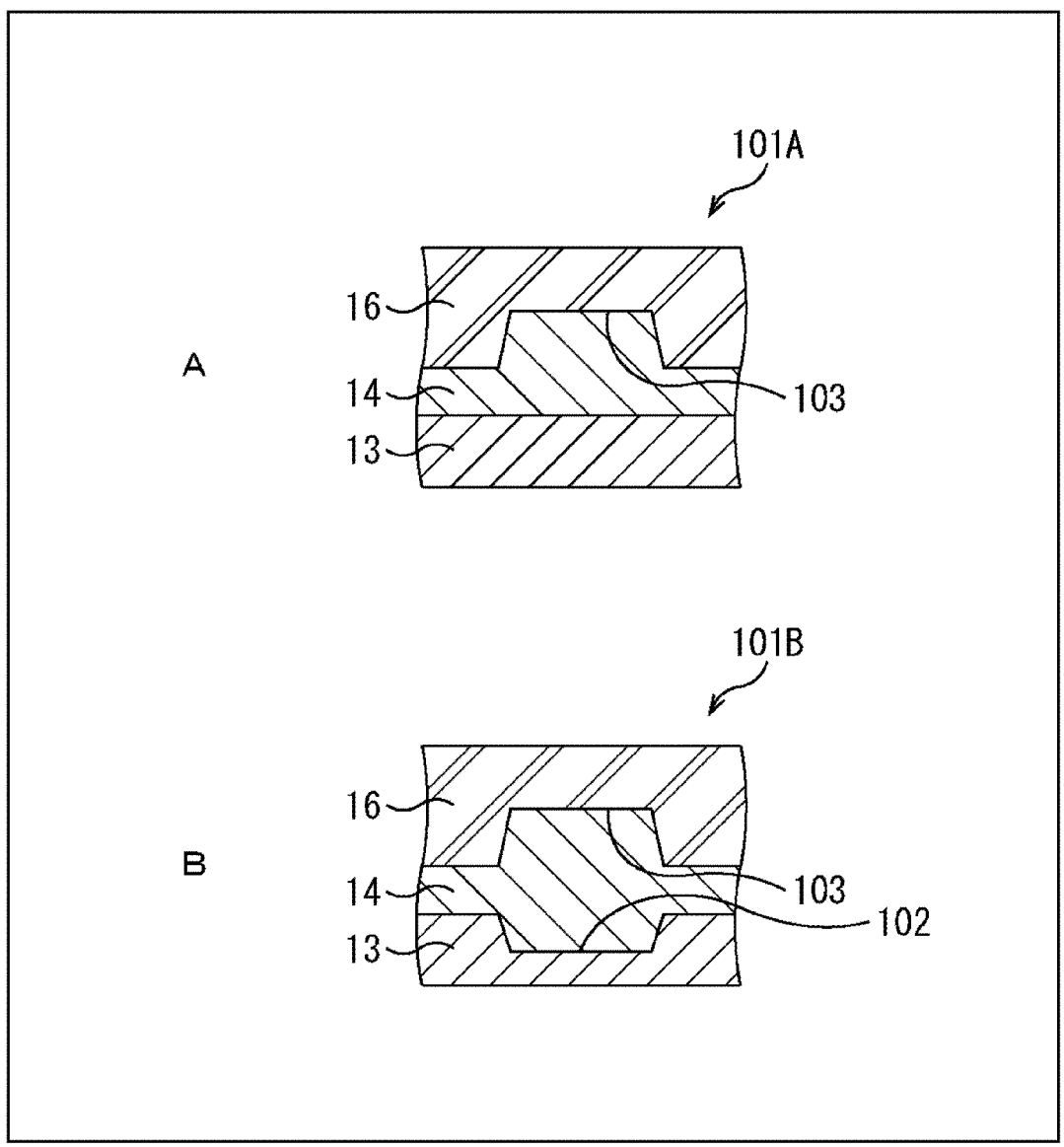
FIG. 10 is a diagram showing other structures of an excavated portion.

For example, A of FIG. 10 shows an excavated portion 101A having a structure in which the sealing resin 14 is embedded in a counterbore portion 103 formed in a manner to excavate the sealing glass 16. Furthermore, B of FIG. 10 shows an excavated portion 101B having a structure in which the sealing resin 14 is embedded both in the counterbore portion 102 provided in the sensor substrate 13 and in the counterbore portion 103 provided in the sealing glass 16.

It is also possible to improve shear strength of the imaging device 11C by adopting the excavated portion 101A and the excavated portion 101B as shown in FIG. 10.

Note that the cross-sectional shape of the counterbore portion 102 included in the excavated portion 101 is not limited to a trapezoidal recess shape with a tapered surface having a width that decreases as the sensor substrate 13 is excavated down, as shown in B of FIG. 9, and it is also possible to adopt another cross-sectional shape.

Figure 11:
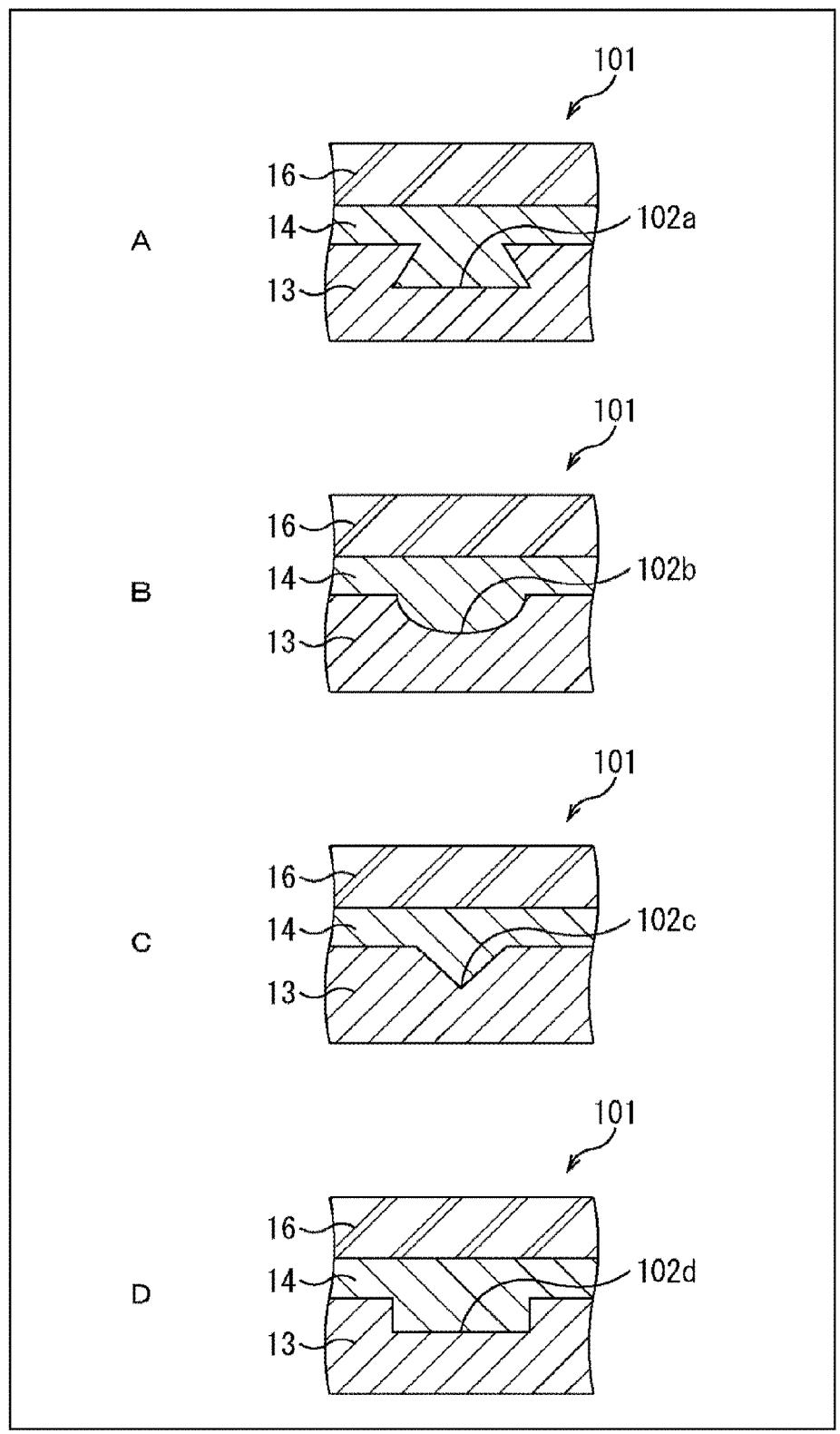
FIG. 11 is a diagram showing variations of a cross-sectional shape.

For example, A of FIG. 11 shows a counterbore Portion 102a having a cross section formed in a trapezoidal recess shape with a tapered surface having a width that increases as the sensor substrate 13 is excavated down. Furthermore, B of FIG. 11 shows a counterbore portion 102b having a cross section formed in a concave shape. In addition, C of FIG. 11 shows a counterbore portion 102c having a cross section formed in a recess shape with a tapered surface having a vertex. Moreover, D of FIG. 11 shows a counterbore portion 102d having a cross section formed in a recess shape with a side surface that is substantially perpendicular to a surface of the sensor substrate 13.

In this manner, the imaging device 11C can be provided with the excavated portion 101 formed with the counterbore portions 102a to 102d having various cross-sectional shapes.

Figure 12:
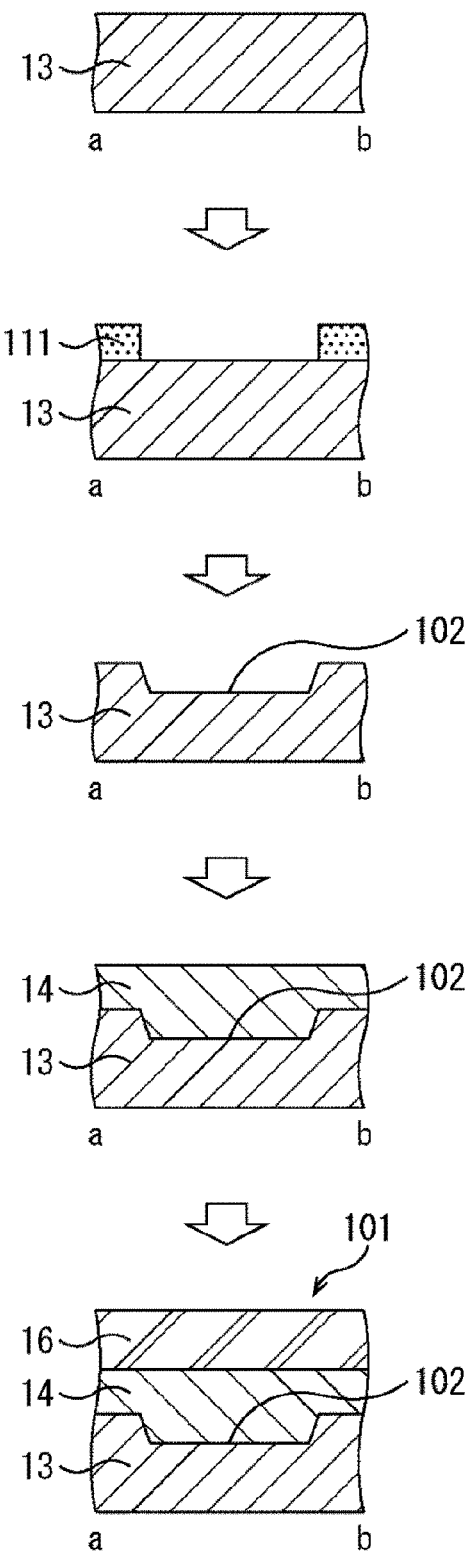
FIG. 12 is a diagram for describing a method of manufacturing the imaging device shown in FIG. 9.

A method of manufacturing the imaging device 11C will be described with reference to FIG. 12. Note that description regarding a cross-sectional part taken along the line a-b shown in A of FIG. 9 is provided in FIG. 12, while a method of manufacturing the other part is similar to the conventional method.

In a first step, the effective pixel area 17 as shown in A of FIG. 9 is formed in a central region of the sensor substrate 13.

In a second step, the sensor substrate 13 is patterned with a photoresist 111 except portions in which the excavated portions 101 are to be formed (four portions in the example shown in A of FIG. 9) in the outer peripheral region of the sensor substrate 13 such that the portions, in which the excavated portions 101 are to be formed, form openings.

In a third step, for example, dry etching is performed to form the counterbore portion 102 in the sensor substrate 13 at the opening in the photoresist 111.

In a fourth step, a resin material to be the sealing resin 14 is applied to an entire surface of the sensor substrate 13. At this time, the resin material is applied such that the counterbore portion 102 is also filled with the resin material.

In a fifth step, the sealing glass 16 is stuck to the sealing resin 14 at a wafer level, and then, the wafer is diced. Thus, it is possible to manufacture the imaging device 11C provided with the excavated portion 101. Note that even if imaging devices have structures in which the excavated portion 101A and the excavated portion 191E as shown in FIG. 10 are provided, it is also possible to manufacture such imaging devices in a similar manufacturing process.

Figure 13:
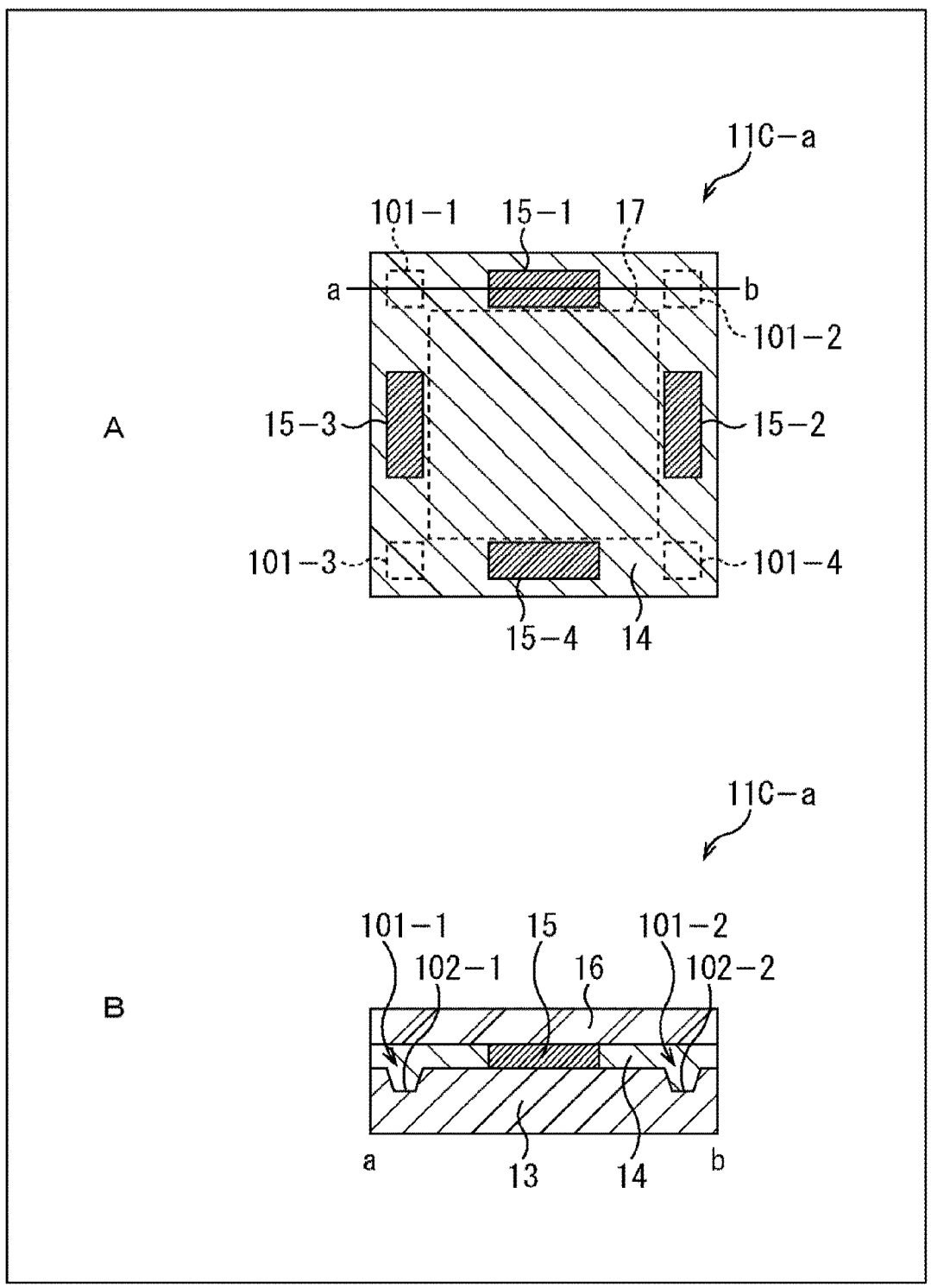
FIG. 13 is a diagram showing a variation of the imaging device shown in FIG. 9.

A variation of the imaging device 11C will be described with reference to FIG. 13. A plan view of a configuration example of an imaging device 11C-a is shown in A of FIG. 13, and a cross-sectional view taken along a line a-b shown in A of FIG. 13 is shown in B of FIG. 13. Note that in the imaging device 11C-a, configurations adopted in common with the imaging device 11C shown in FIG. 9 are denoted by the same reference signs, and detailed descriptions thereof will be omitted.

As shown in A of FIG. 13, in the imaging device 11C-a, excavated portions 101-1 to 101-4 are formed as with the imaging device 11C shown in FIG. 9, and in addition, reinforcing resins 15-1 to 15-4 are formed. For example, a resin material with higher rigidity than that of a sealing resin 14 is selected for the reinforcing resins 15-1 to 15-4 so as to reinforce bonding strength of a sensor substrate 13 and a sealing glass 16.

The reinforcing resins 15-1 to 15-4 are formed, for example, at four positions in the vicinity of four sides in an outer peripheral region located outside an effective pixel area 17. Furthermore, as shown in B of FIG. 13, the reinforcing resin 15-1 is formed so as to bond the sensor substrate 13 and the sealing glass 16, and although not shown, the reinforcing resins 15-3 to 15-4 are also formed in a manner similar to the reinforcing resin 15-1.

In the imaging device 11C-a thus formed, it is possible to satisfactorily bond the sensor substrate 13 and the sealing glass 16, and to enhance bonding strength thereof.

Figure 14:
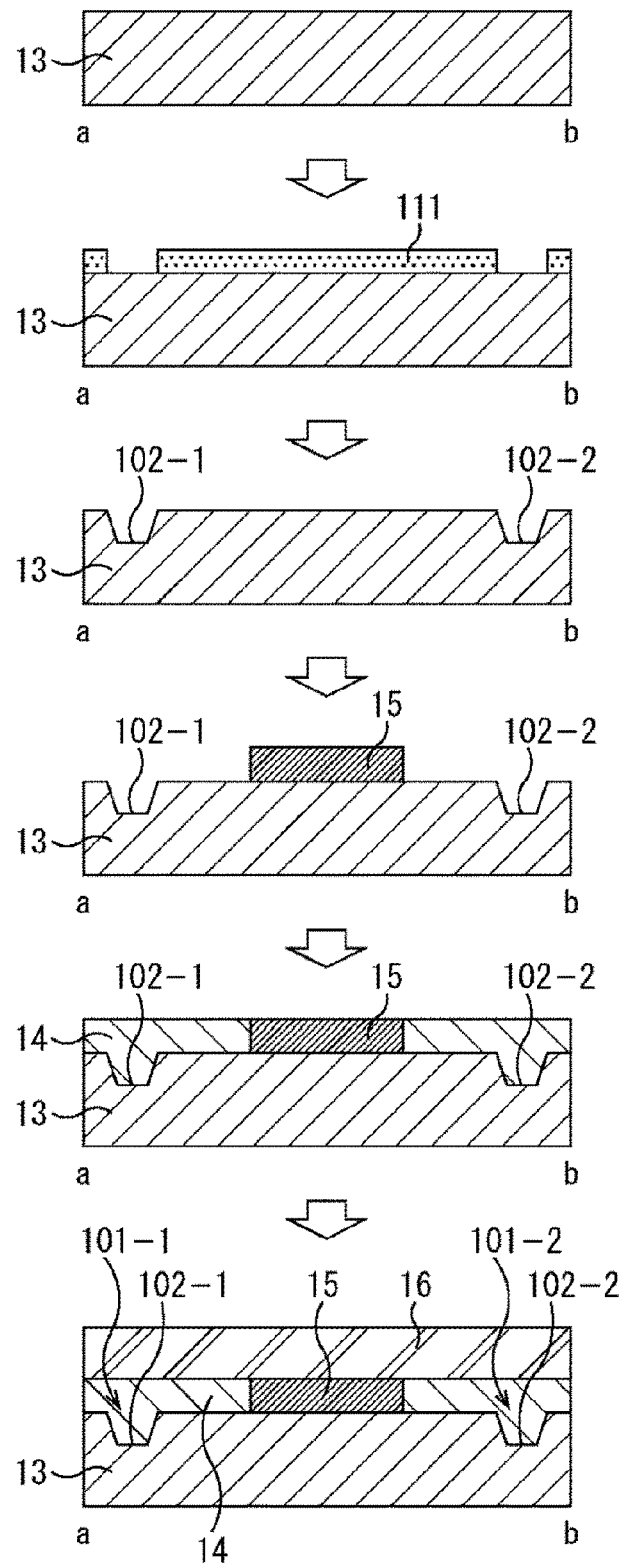
FIG. 14 is a diagram for describing a method of manufacturing the imaging device shown in FIG. 13.

A method of manufacturing the imaging device 11C-a will be described with reference to FIG. 14. Note that description regarding a cross-sectional part taken along the line a-b shown in A of FIG. 13 is provided in FIG. 14, while a method of manufacturing the other part is similar to the conventional method.

In a first step, the effective pixel area 17 as shown in A of FIG. 13 is formed in a central region of the sensor substrate 13.

In a second step, the sensor substrate 13 is patterned with a photoresist 111 except portions in which the excavated portions 101 are to be formed (four portions in the example shown in A of FIG. 9) in the outer peripheral region of the sensor substrate 13 such that the portions, in which the excavated portions 101 are to be formed, form openings.

In a third step, for example, dry etching is performed to form the counterbore portion 102 in the sensor substrate 13 at the opening in the photoresist 111.

In a fourth step, the reinforcing resins 15-1 to 15-4 are formed. For example, a resin material to be the reinforcing resin 15 is applied to an entire surface of the sensor substrate 13 on the effective pixel area 17 side. Then, photoresist is applied to the resin material. Alternatively, application of photoresist and dry etching are performed. Thus, unnecessary portions of the resin material are removed to form the reinforcing resins 15-1 to 15-4.

In a fifth step, a resin material to be the sealing resin 14 is applied to an entire surface of the effective pixel area 17 of the sensor substrate 13 except the portions where the reinforcing resins 15-1 to 15-4 have been formed. At this time, the resin material to be the sealing resin 14 is applied in a small amount. Thereafter, chemical mechanical polishing (CMP) is performed. Thus, surfaces of the sealing resin 14 and the reinforcing resins 15-1 to 15-4 are leveled.

In a sixth step, the sealing glass 16 is stuck to the sealing resin 14 and the reinforcing resins 15-1 to 15-4. Thus, it is possible to manufacture the imaging device 11C-a provided with the excavated portion 101 and the reinforcing resins 15-1 to 15-4. Note that even if imaging devices have structures in which the excavated portion 101A and the excavated portion 101B as shown in FIG. 10 are provided, it is also possible to manufacture such imaging devices in a similar manufacturing process.

Figure 15:
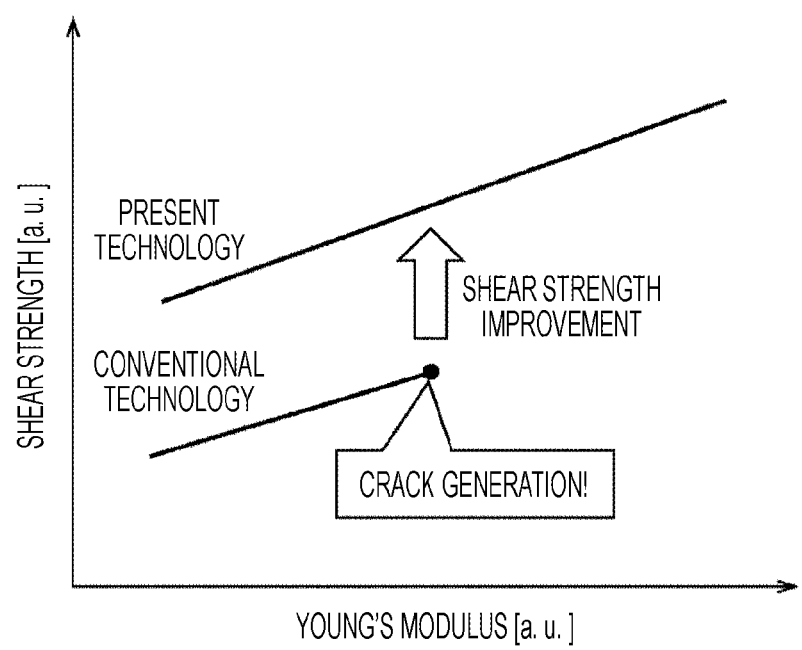
FIG. 15 is a diagram for describing improvement in shear strength.

The imaging device 11C provided with the excavated portion 101 and the imaging device 11C-a provided with the excavated portion 101 and the reinforcing resins 15-1 to 15-4, as described above, can achieve an improvement in shear strength as compared with the conventional techniques which include neither an excavated portion nor a reinforcing resin, as shown in, for example, FIG. 15.

Fourth Configuration Example of Imaging Device

Figure 16:
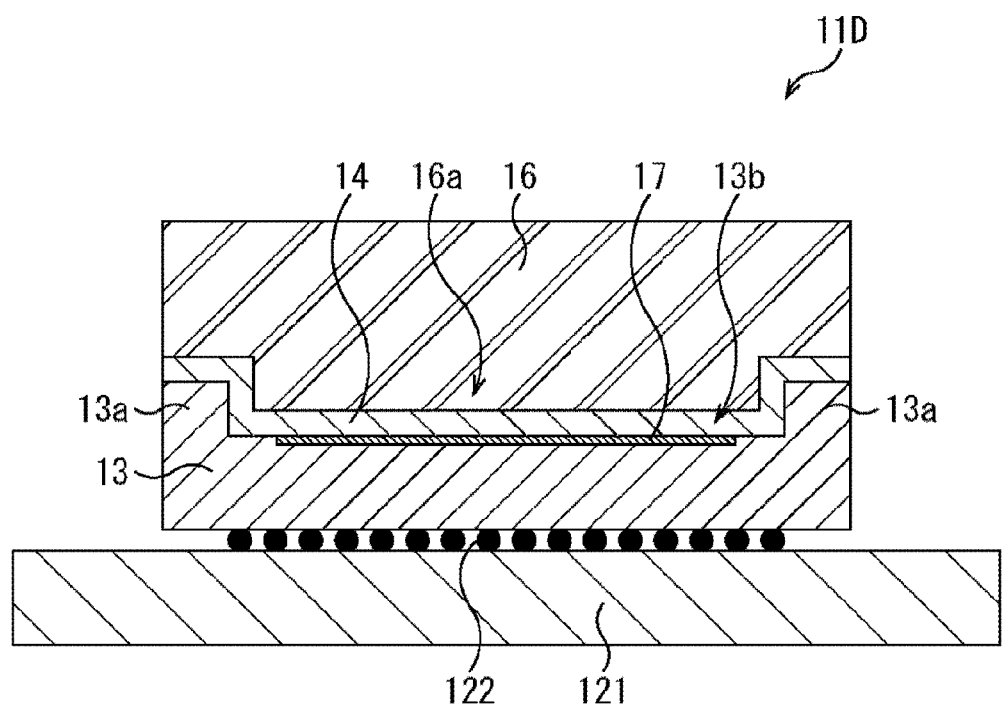
FIG. 16 is a diagram showing a fourth configuration example of the imaging device.

FIG. 16 is a diagram showing a fourth configuration example of the imaging device 11. Note that in an imaging device 11D shown in FIG. 16, configurations adopted in common with the imaging device 11 shown in FIG. 1 are denoted by the same reference signs, and detailed descriptions thereof will be omitted.

FIG. 16 shows a cross-sectional configuration example of the imaging device 11D, in which the imaging device 11D is bonded to a circuit board 121 by use of solder balls 122.

The imaging device 11D is formed such that a central region of a sensor substrate 13 is recessed in a cross-sectional view. Thus, an outer peripheral wall 13a is formed in a manner to surround an outer periphery of the sensor substrate 13, and an effective pixel area 17 is formed in a recessed portion 13b surrounded by the outer peripheral wall 13a. Then, a sealing resin 14 is formed along surfaces of the outer peripheral wall 13a and the recessed portion 13b of the sensor substrate 13. In addition, a sealing glass 16 is placed thereon such that they are stacked in layers. The sealing glass 16 is provided with a protruded portion 16a formed in a protruded shape in accordance with a shape of the recessed portion 13b.

As described above, the imaging device 11D has a configuration in which the protruded portion 16a of the sealing glass 16 is fitted in the recessed portion 13b of the sensor substrate 13. Thus, in the imaging device 11D, it is possible to prevent, for example, occurrence of thermal peeling due to a stress difference between the sensor substrate 13 and the sealing glass 16, and occurrence of peeling at a boundary surface due to insufficient adhesion.

Furthermore, the imaging device 11D includes the effective pixel area 17 formed in the recessed portion 13b of the sensor substrate 13, and the outer peripheral wall 13a provided in a manner to surround the outer periphery thereof. Thus, with the outer peripheral wall 13a, it is possible to prevent stray light from entering the effective pixel area 17.

A variation of the imaging device 11D will be described with reference to FIG. 17. Note that in an imaging device 11D-a shown in FIG. 17, configurations adopted in common with the imaging device 11D shown in FIG. 16 are denoted by the same reference signs, and detailed descriptions thereof will be omitted.

Figure 17:
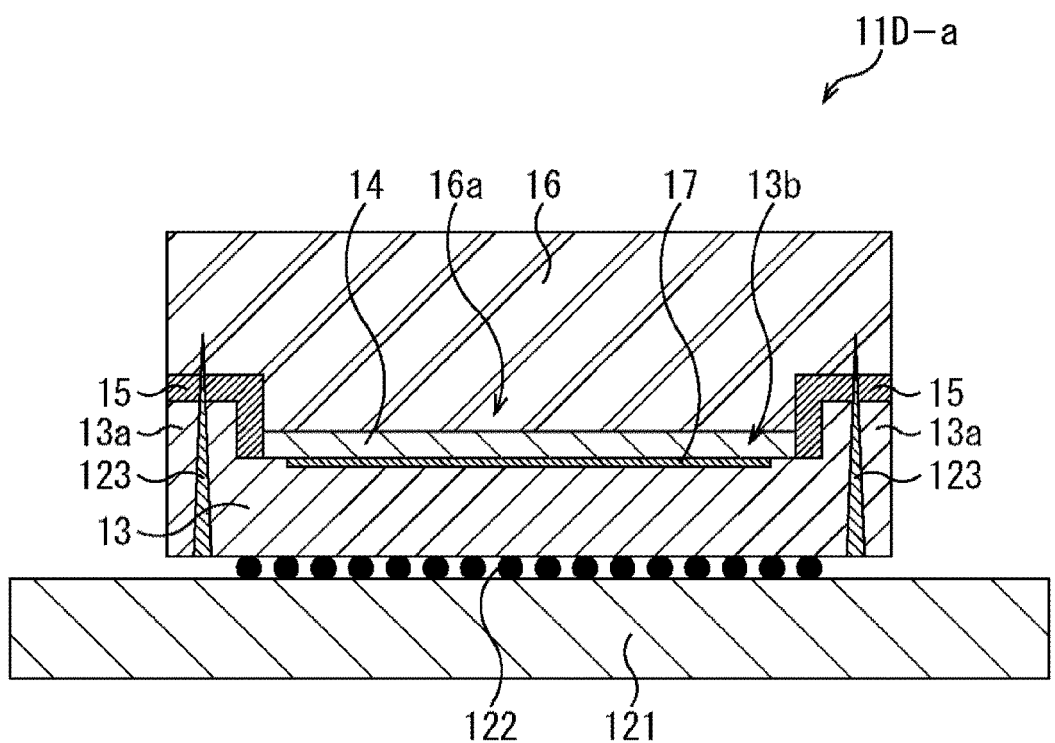
FIG. 17 is a diagram showing a first variation of the imaging device shown in FIG. 16.

As shown in FIG. 17, the imaging device 11D-a has the following structure. As with the imaging device 11D shown in FIG. 16, a protruded portion 16a of a sealing glass 16 is formed in a manner to be fitted in a recessed portion 13b of a sensor substrate 13. In addition, a reinforcing resin 15 and an anchoring member 123 are formed.

In the imaging device 11D-a, the reinforcing resin 15 is formed in a manner to bond the sensor substrate 13 and the sealing glass 16 along an outer peripheral wall 13a of the sensor substrate 13.

The anchoring member 123 is formed so as to reinforce fixing of the sensor substrate 13 and the sealing glass 16 such that the anchoring member 123 penetrates the reinforcing resin 15 from the sensor substrate 13 side to reach the sealing glass 16 in an outer peripheral region of the imaging device 11D-a. For example, the anchoring member 123 is formed as follows. There is formed a groove that penetrates the reinforcing resin 15 from the sensor substrate 13 to reach the sealing glass 16. Then, a material having higher strength than the reinforcing resin 15 is embedded in the groove.

Figure 18:
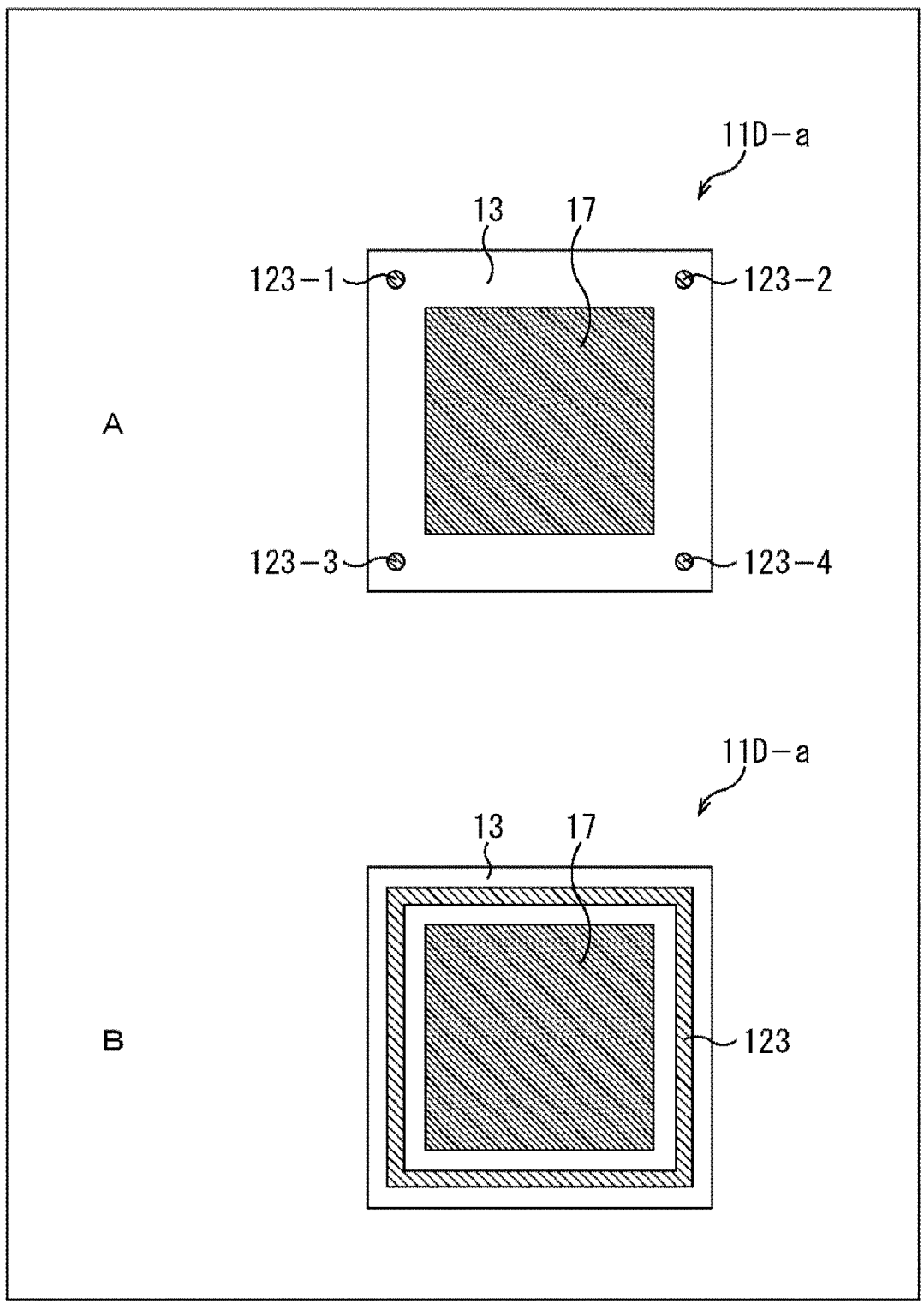
FIG. 18 is a diagram showing planar configuration examples of the imaging device shown in FIG. 17.

For example, in the imaging device 11D-a, it is possible to form anchoring members 123-1 to 123-4 at four positions in the vicinity of four corners as shown in A of FIG. 18. Furthermore, in the imaging device 11D-a, it is possible to form the anchoring member 123 at an outer periphery of an effective pixel area 17 in a manner to surround the effective pixel area 17 as shown in B of FIG. 18.

In the imaging device 11D-a configured as described above, it is possible to enhance resistance to thermal peeling due to a stress difference between the sensor substrate 13 and the sealing glass 16, and resistance to peeling at a boundary surface due to insufficient adhesion such that the resistance becomes higher than that of the imaging device 11D shown in FIG. 16. Furthermore, in the imaging device 11D-a, it is possible to prevent stray light from entering the effective pixel area 17 as with the imaging device 11D shown in FIG. 16.

A method of manufacturing the imaging device 11D-a will be described with reference to FIGS. 19 and 20. Note that description regarding a cross-sectional part similar to that shown in FIG. 17 is provided in FIGS. 19 and 20, while a method of manufacturing the other part is similar to the conventional method.

Figure 19:
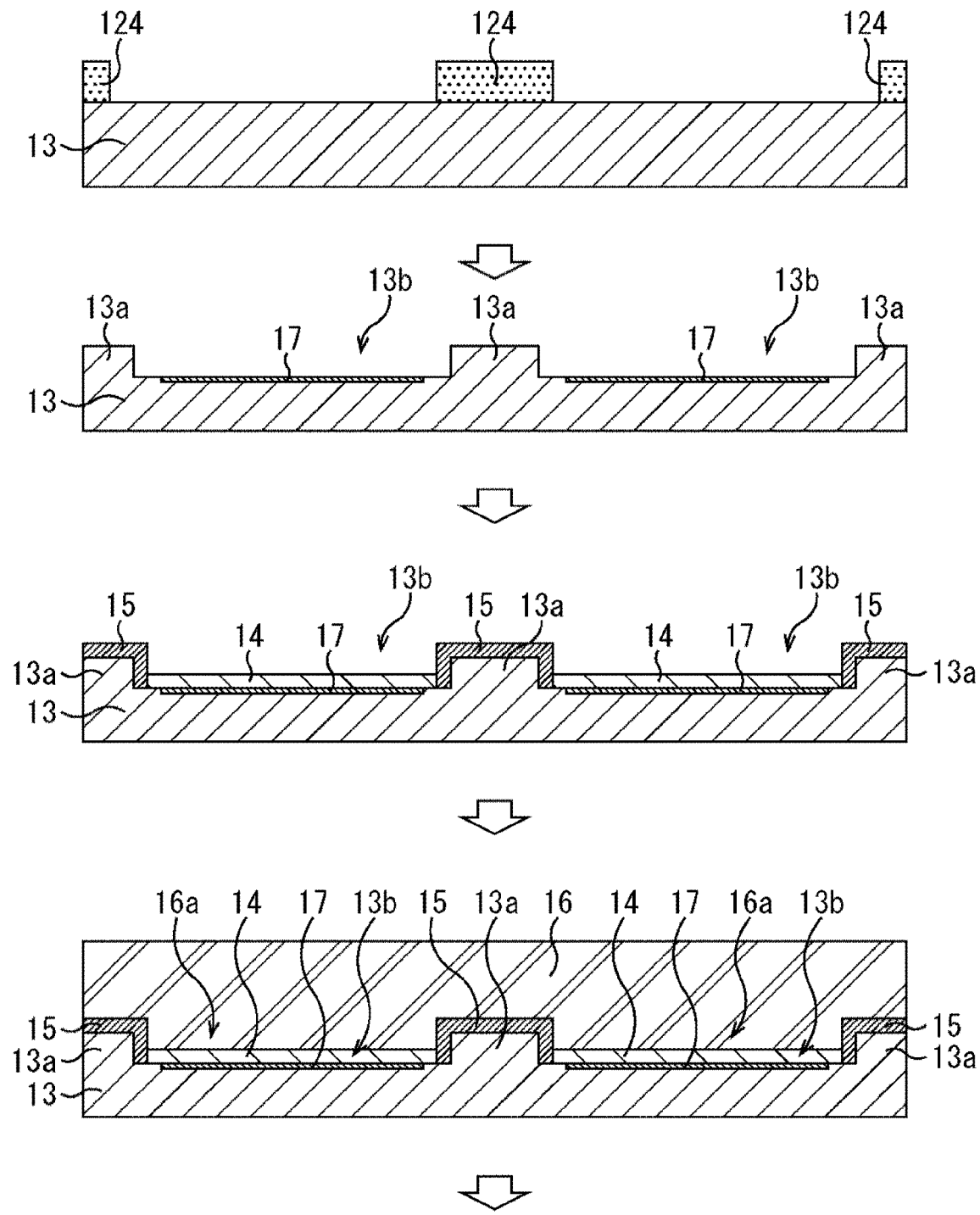
FIG. 19 is a diagram for describing a method of manufacturing the imaging device shown in FIG. 17.

First, in a first step, the sensor substrate 13 is patterned with a photoresist 124 except a portion in which the recessed portion 13b is to be formed in a central region of the sensor substrate 13 such that the portion, in which the recessed portion 13b is to be formed, forms an opening, as shown in FIG. 19.

In a second step, for example, dry etching is performed to form the recessed portion 13b in the sensor substrate 13 at the opening in the photoresist 124. Thereafter, the photoresist 124 is removed to form the effective pixel area 17 in the central region of the recessed portion 13b.

In a third step, a sealing resin 14 and the reinforcing resin 15 are applied to a surface of the sensor substrate 13.

In a fourth step, the sealing glass 16 is stuck to the sensor substrate 13 such that the protruded portion 16a is fitted in the recessed portion 13b of the sensor substrate 13.

Figure 20:
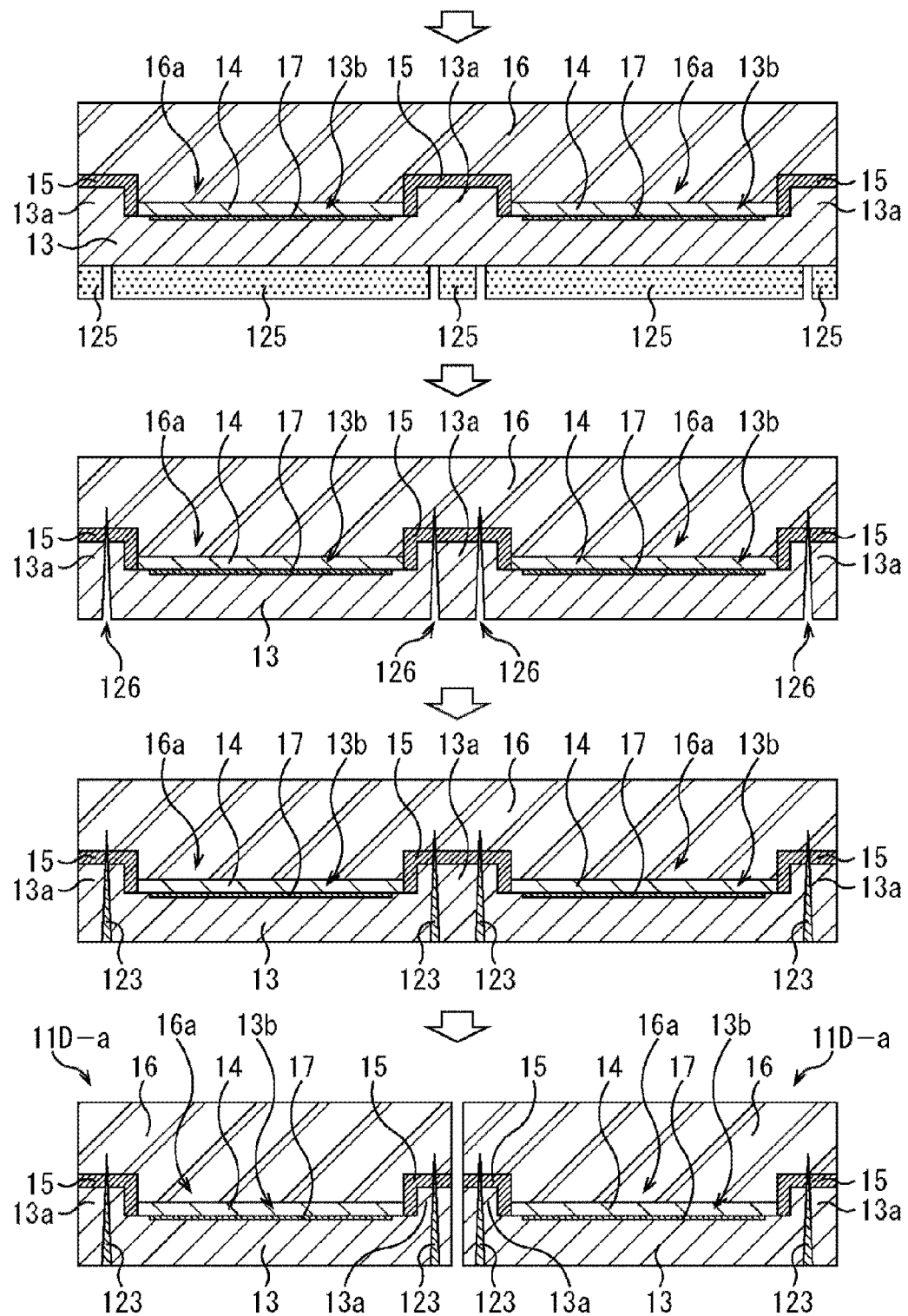
FIG. 20 is a diagram for describing the method of manufacturing the imaging device shown in FIG. 17.

Subsequently, in a fifth step, the sensor substrate 13 is patterned with a photoresist 125 except portions at which the anchoring members 123 are to be formed in an outer peripheral region of the sensor substrate 13 such that the portions, at which the anchoring members 123 are to be formed, form openings as shown in FIG. 20.

In a sixth step, for example, dry etching is performed to form grooves 126 in the sensor substrate 13 at the openings in the photoresist 125. Thereafter, the photoresist 125 is removed.

In a seventh step, for example, copper is embedded in the grooves 126 of the sensor substrate 13 to form the anchoring members 123.

In an eighth step, a wafer is diced. Thus, it is possible to manufacture the imaging device 11D-a in which the protruded portion 16a of the sealing glass 16 is fitted in the recessed portion 13b of the sensor substrate 13, and the anchoring members 123 are provided.

Figure 21:
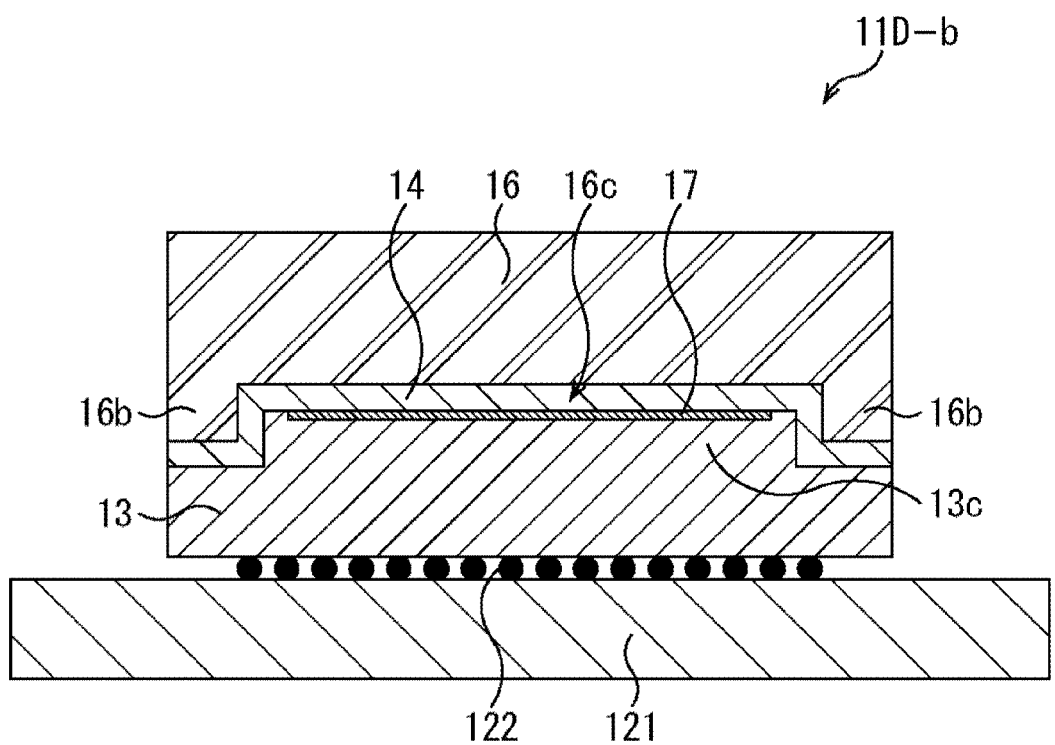
FIG. 21 is a diagram showing a second variation of the imaging device shown in FIG. 16.

FIG. 21 is a diagram showing a second variation of the imaging device 11D. Note that in an imaging device 11D-b shown in FIG. 21, configurations adopted in common with the imaging device 11D shown in FIG. 16 are denoted by the same reference signs, and detailed descriptions thereof will be omitted.

As shown in FIG. 21, the imaging device 11D-b is provided with a protruded portion 13c formed in a protruded shape in a cross-sectional view, in a central region of a sensor substrate 13. In addition, an effective pixel area 17 is formed on the protruded portion 13c. Then, in the imaging device 11D-b, an outer peripheral wall 16b is formed in a manner to surround an outer periphery of a sealing glass 16, and the sealing glass 16 and the sensor substrate 13 are stacked in layers such that the protruded portion 13c is fitted in a recessed portion 16c surrounded by the outer peripheral wall 16b.

That is, the imaging device 11D-b has a configuration opposite to that of the imaging device 11D shown in FIG. 16 in terms of a recess-protrusion relationship between the sensor substrate 13 and the sealing glass 16. Therefore, in the imaging device 11D-b, it is possible to prevent, for example, occurrence of thermal peeling due to a stress difference between the sensor substrate 13 and the sealing glass 16, and occurrence of peeling at a boundary surface due to insufficient adhesion, as with the imaging device 11D shown in FIG. 16.

Note that the imaging device 11D-b may also be provided with a reinforcing resin 15 and an anchoring member 123, as with the imaging device 11D-a shown in FIG. 17.

Fifth Configuration Example of Imaging Device

Figure 22:
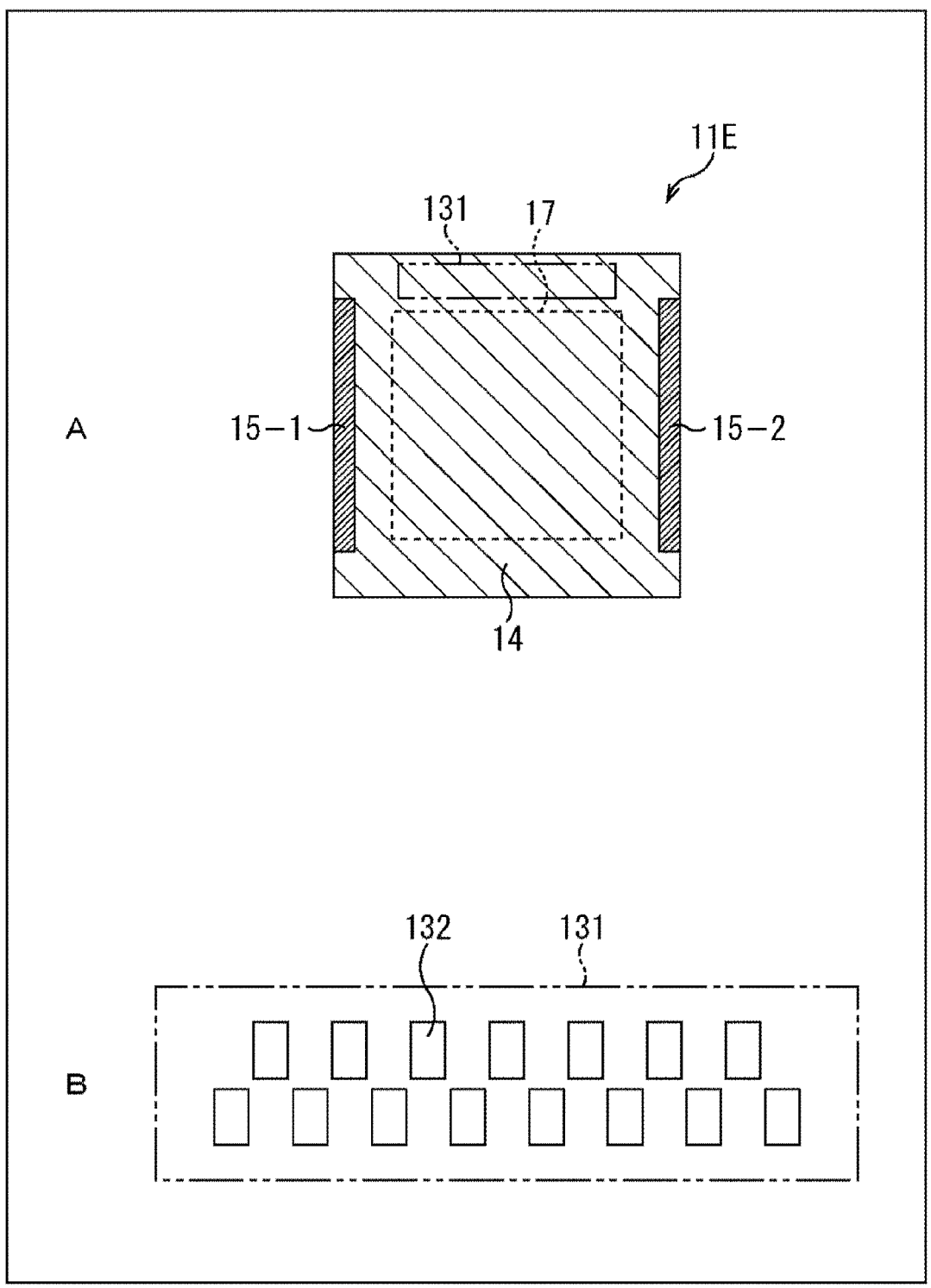
FIG. 22 is a diagram showing a fifth configuration example of the imaging device.

FIG. 22 is a diagram showing a fifth configuration example of the imaging device 11. A plan view of a configuration example of an imaging device 11E is shown in A of FIG. 22, and an enlarged view of a pad opening area 131 provided in the imaging device 11E is shown in B of FIG. 22. Note that in the imaging device 11E shown in FIG. 22, configurations adopted in common with the imaging device 11 shown in FIG. 1 are denoted by the same reference signs, and detailed descriptions thereof will be omitted.

As shown in A of FIG. 22, the imaging device 11E includes the pad opening area 131 provided along one side of an outer peripheral region located outside an effective pixel area 17. The pad opening area 131 includes pad openings 132 formed, as shown in B of FIG. 22, for opening pads for connecting the imaging device 11E to the outside by using, for example, bonding wire.

Figure 23:
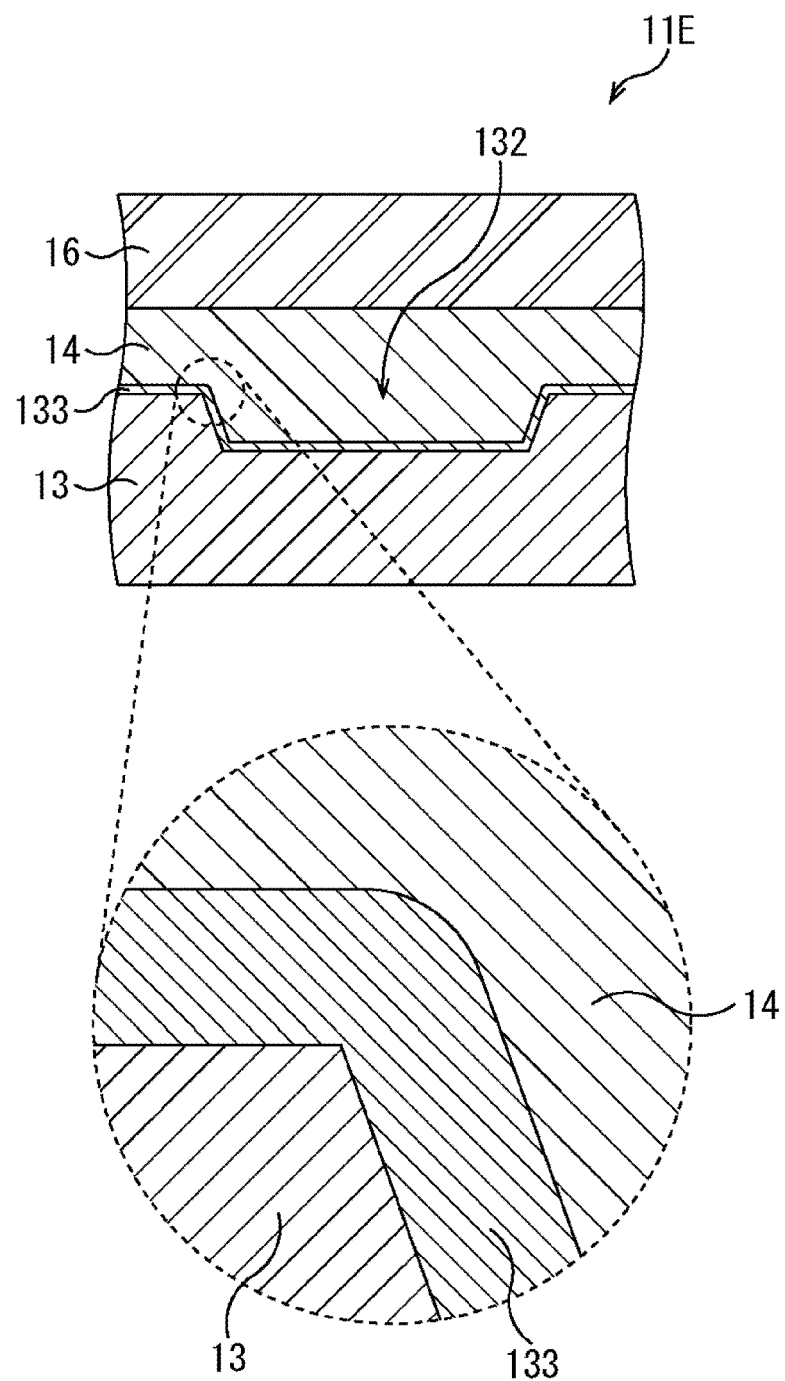
FIG. 23 is an enlarged view of a pad opening.

FIG. 23 shows a cross-sectional configuration example of the pad opening 132 formed in the imaging device 11E.

As shown in FIG. 23, the pad opening 132 is formed in a manner to excavate a sensor substrate 13. Then, in the configuration example shown in FIG. 23, a thin film 133 is formed on a surface of the sensor substrate 13 in which the pad opening 132 has been formed, and a sealing resin 14 is placed on the sensor substrate 13 via the thin film 133 such that they are stacked in layers.

For example, in a case where etching is performed to form the pad opening 132 in the sensor substrate 13, a stepped portion where the pad opening 132 is provided is formed at an acute angle. Then, sharpness of the angle formed at the stepped portion is reduced by the thin film 133 formed on the sensor substrate 13 as shown in an enlarged view of FIG. 23. In other words, the thin film 133 is formed such that a curved surface is formed. It is thus possible to prevent, for example, generation of local stress assumed in a configuration in which the sealing resin 14 is placed directly on the stepped portion of the pad opening 132 such that they are stacked in layers, by providing roundness at the stepped portion of the pad opening 132 by the thin film 133 as described above.

Therefore, in the imaging device 11E, it is possible to avoid concentration of stress on the stepped portion of the pad opening 132, and to prevent local stress by forming the thin film 133 on the sensor substrate 13. As a result, it is possible to prevent a fracture of the sealing resin 14.

Figure 24:
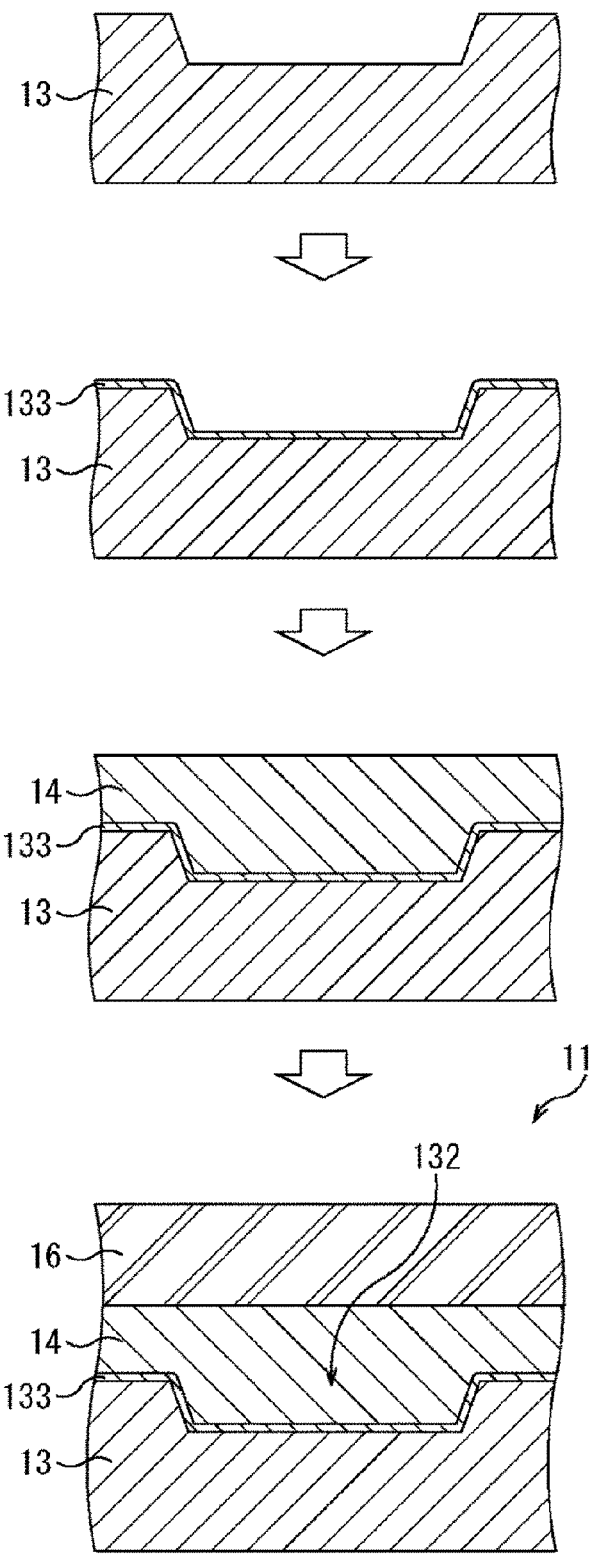
FIG. 24 is a diagram for describing a method of manufacturing the imaging device shown in FIG. 22.

A method of manufacturing the imaging device 11E will be described with reference to FIG. 24. Note that description regarding a cross-sectional part shown in FIG. 23 is provided in FIG. 24, while a method of manufacturing the other part is similar to the conventional method.

In a first step, a recess to be the pad opening 132 is formed in the sensor substrate 13 by dry etching or the like.

In a second step, the thin film 133 is formed on the sensor substrate 13. As a result, the stepped portion of the recess to be the pad opening 132 is formed with a curved surface.

In a third step, a resin material to be the sealing resin 14 is applied, and in a fourth step, a sealing glass 16 is stuck thereto.

Through the above steps, it is possible to manufacture the imaging device 11E in which sharpness of the angle formed at the stepped portion of the pad opening 132 is reduced.

Figure 25:
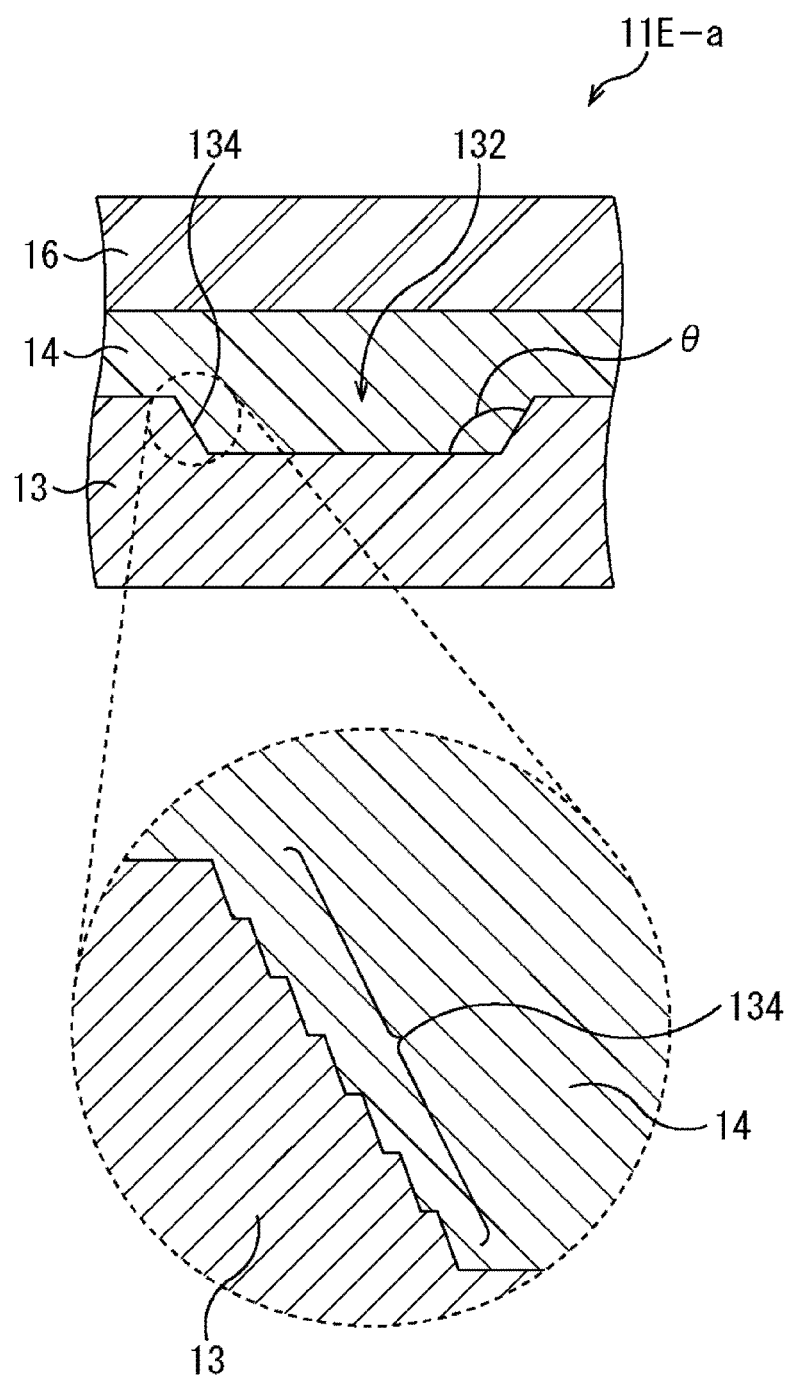
FIG. 25 is a diagram showing a variation of the imaging device shown in FIG. 22.

A variation of the imaging device 11E will be described with reference to FIG. 25. As with FIG. 23, FIG. 25 shows a cross-sectional configuration example of a pad opening 132 formed in an imaging device 11E-a. Note that in the imaging device 11E-a, configurations adopted in common with the imaging device 11E shown in FIGS. 22 and 23 are denoted by the same reference signs, and detailed descriptions thereof will be omitted.

As shown in FIG. 25, in the imaging device 11E-a, a side surface 134 of the pad opening 132 is formed with a gradient θ which is lower than that of the imaging device 11E shown in FIGS. 22 and 23. As a result, it is possible to reduce sharpness of an angle formed at a stepped portion where the pad opening 132 of the imaging device 11E-a is provided. Therefore, it is possible to prevent generation of local stress also in the imaging device 11E-a, as with the imaging device 11E shown in FIGS. 22 and 23.

For example, as shown in the enlarged view of FIG. 23, the side surface 134 of the pad opening 132 provided in the imaging device 11E-a is processed and formed such that multiple steps are formed thereon. Accordingly, although an inclination of each step of the side surface formed with multiple steps is similar to that of the pad opening 132 of the imaging device 11E shown in FIG. 23, it is possible to reduce the gradient θ of the side surface 134 as a whole by processing and forming the side surface with multiple steps as shown in the drawing.

Thus, in the imaging device 11E, it is possible to avoid concentration of stress on the stepped portion of the pad opening 132, and to prevent local stress by reducing the gradient θ of the side surface 134 of the pad opening 132. As a result, even when the imaging device 11E-a has a configuration in which a sealing resin 14 is placed directly on a sensor substrate 13 such that they are stacked in layers, it is possible to prevent a fracture of the sealing resin 14.

Figure 26:
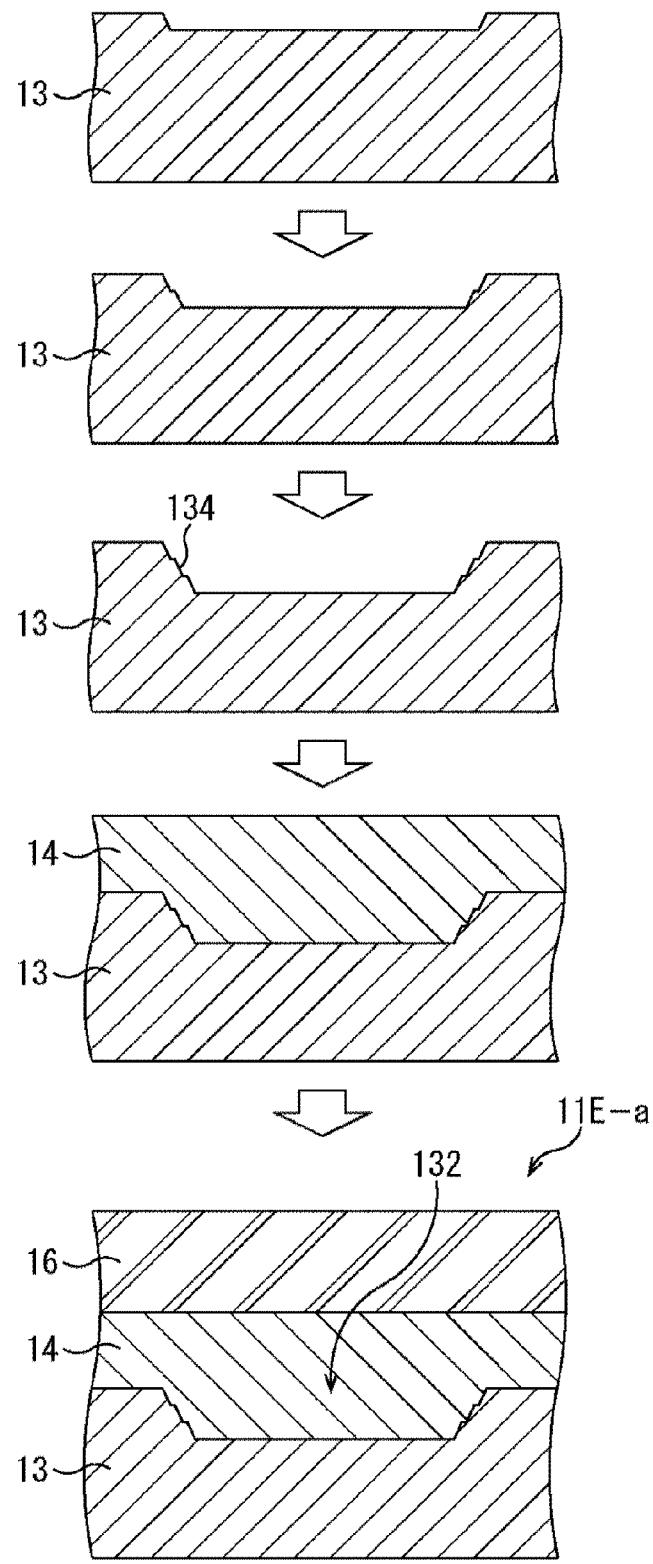
FIG. 26 is a diagram for describing a method of manufacturing the imaging device shown in FIG. 25.

A method of manufacturing the imaging device 11E-a will be described with reference to FIG. 26. Note that description regarding a cross-sectional part shown in FIG. 25 is provided in FIG. 26, while a method of manufacturing the other part is similar to the conventional method.

In a first step to a step of FIG. 3, a recess to be the pad opening 132 is formed with multiple steps in the sensor substrate 13 by dry etching or the like. As a result, it is possible to form the side surface 134 with the lower gradient θ. Note that an example of forming three steps on the side surface 134 is described here, while the side surface 134 is formed with multiple steps such that three or more steps are formed.

In a fourth step, a resin material to be the sealing resin 14 is applied, and in a fifth step, a sealing glass 16 is stuck thereto.

Through the above steps, it is possible to manufacture the imaging device 11E-a in which sharpness of the angle formed at the stepped portion is reduced by formation of the side surface 134 of the pad opening 132 with a lower gradient.

In the imaging device 11E and the imaging device 11E-a configured as described above, it is also possible to avoid concentration of stress caused by, for example, expansion, contraction, or the like of the sealing resin 14 due to a change in temperature when a thermal shock test is performed. As a result, occurrence of a fracture can be prevented.

Cross-sectional variations of the pad opening 132 will be described with reference to FIG. 27.

Figure 27:
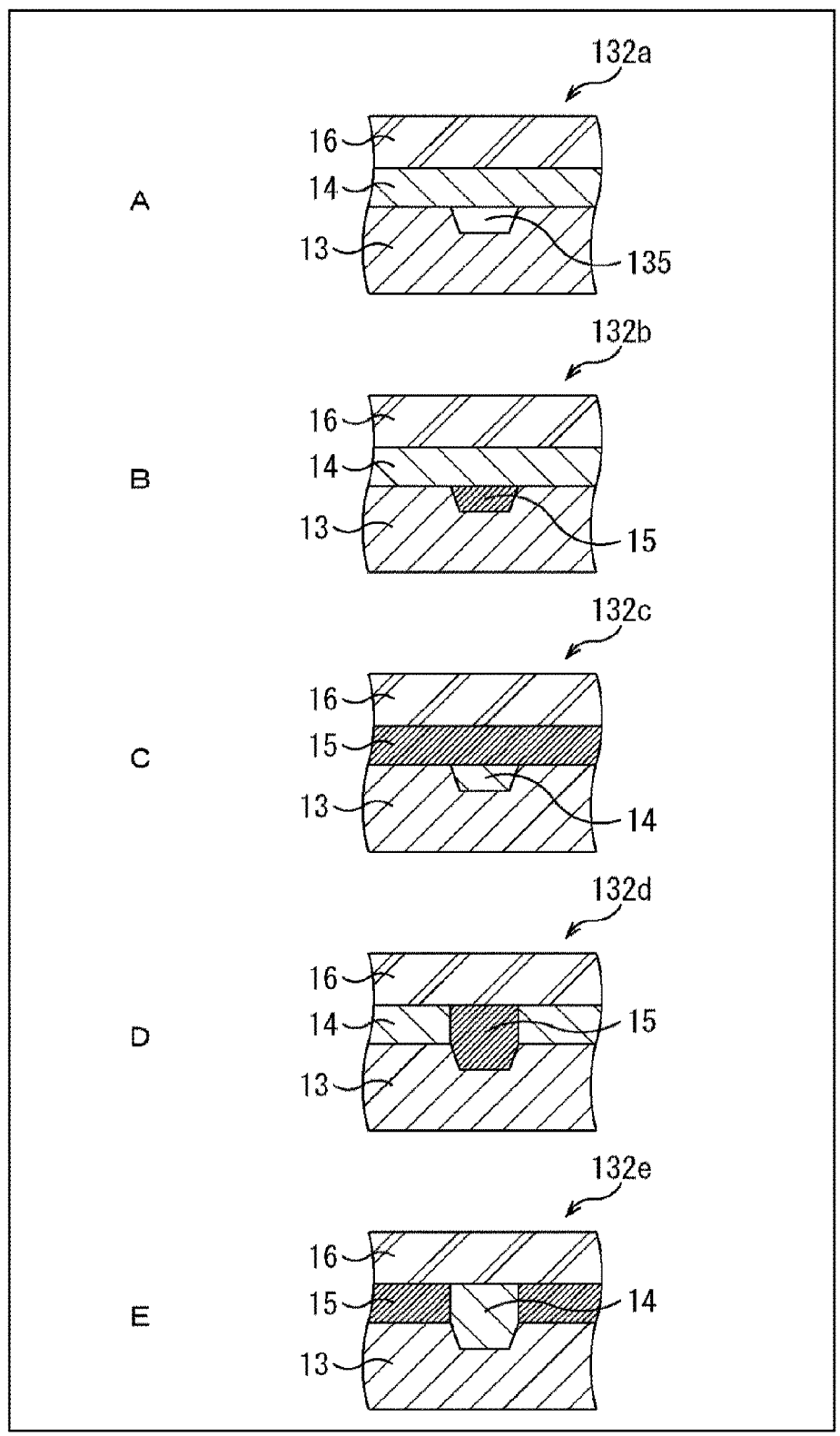
FIG. 27 is a diagram showing cross-sectional variations of the pad opening.

In a pad opening 132a shown in A of FIG. 27, an air gap 135 is provided in the pad opening 132. In other words, the pad opening 132a is formed such that the pad opening 132a is hollow and not filled with a sealing resin 14. As a result of providing the pad opening 132a having such a configuration, no step is formed on the sealing resin 14. It is thus possible to avoid occurrence of a fracture of the sealing resin 14.

In a pad opening 132b shown in B of FIG. 27, an excavated portion to be the pad opening 132b is filled with a reinforcing resin 15 such that the reinforcing resin 15 has a flat surface on the same level as a surface of a sensor substrate 13. Then, a sealing resin 14 is formed, in a planar manner, on the surfaces of the sensor substrate 13 and the reinforcing resin 15. As a result of filling the pad opening 132b with the reinforcing resin 15 in this manner, no step is formed on the sealing resin 14. It is thus possible to avoid occurrence of a fracture of the sealing resin 14.

In a pad opening 132c shown in C of FIG. 27, an excavated portion to be the pad opening 132c is filled with a sealing resin 14 such that the sealing resin 14 has a flat surface on the same level as a surface of a sensor substrate 13. Then, a reinforcing resin 15 is formed, in a planar manner, on the surfaces of the sensor substrate 13 and the sealing resin 14. As a result of filling the pad opening 132c with the sealing resin 14 in this manner, no step is formed on the sealing resin 14. It is thus possible to avoid occurrence of a fracture of the sealing resin 14.

In a pad opening 132d shown in D of FIG. 27, a reinforcing resin 15 is formed such that the reinforcing resin 15 extends from an excavated portion to be the pad opening 132d to a sealing glass 16, and a sealing resin 14 is formed around the reinforcing resin 15. In other words, in a planar view thereof, only the reinforcing resin 15 is formed in an area where the pad opening 132d is formed such that the sealing resin 14 does not enter the pad opening 132d. In the pad opening 132d with such a configuration, as a result of preventing a step from being formed on the sealing resin 14, it is possible to avoid occurrence of a fracture of the sealing resin 14.

In a pad opening 132e shown in E of FIG. 27, a sealing resin 14 is formed such that the sealing resin 14 extends from an excavated portion to be the pad opening 132e to a sealing glass 16, and a reinforcing resin 15 is formed around the sealing resin 14. In other words, in a planar view thereof, the sealing resin 14 is formed only in an area where the pad opening 132e is formed such that the sealing resin 14 is not formed at a stepped portion of the pad opening 132e. In the pad opening 132e with such a configuration, as a result of preventing a step from being formed on the sealing resin 14, it is possible to avoid occurrence of a fracture of the sealing resin 14.

As described with reference to FIG. 27, it is possible to avoid occurrence of a fracture of the sealing resin 14 caused by, for example, expansion, contraction, or the like of the sealing resin 14 due to a change in temperature when a thermal shock test is performed, by adopting structures that avoid forming a step on the sealing resin 14 at the stepped portions of the pad openings 132a to 132e Planar variations of the pad opening 132 will be described with reference to FIG. 28.

Figure 28:
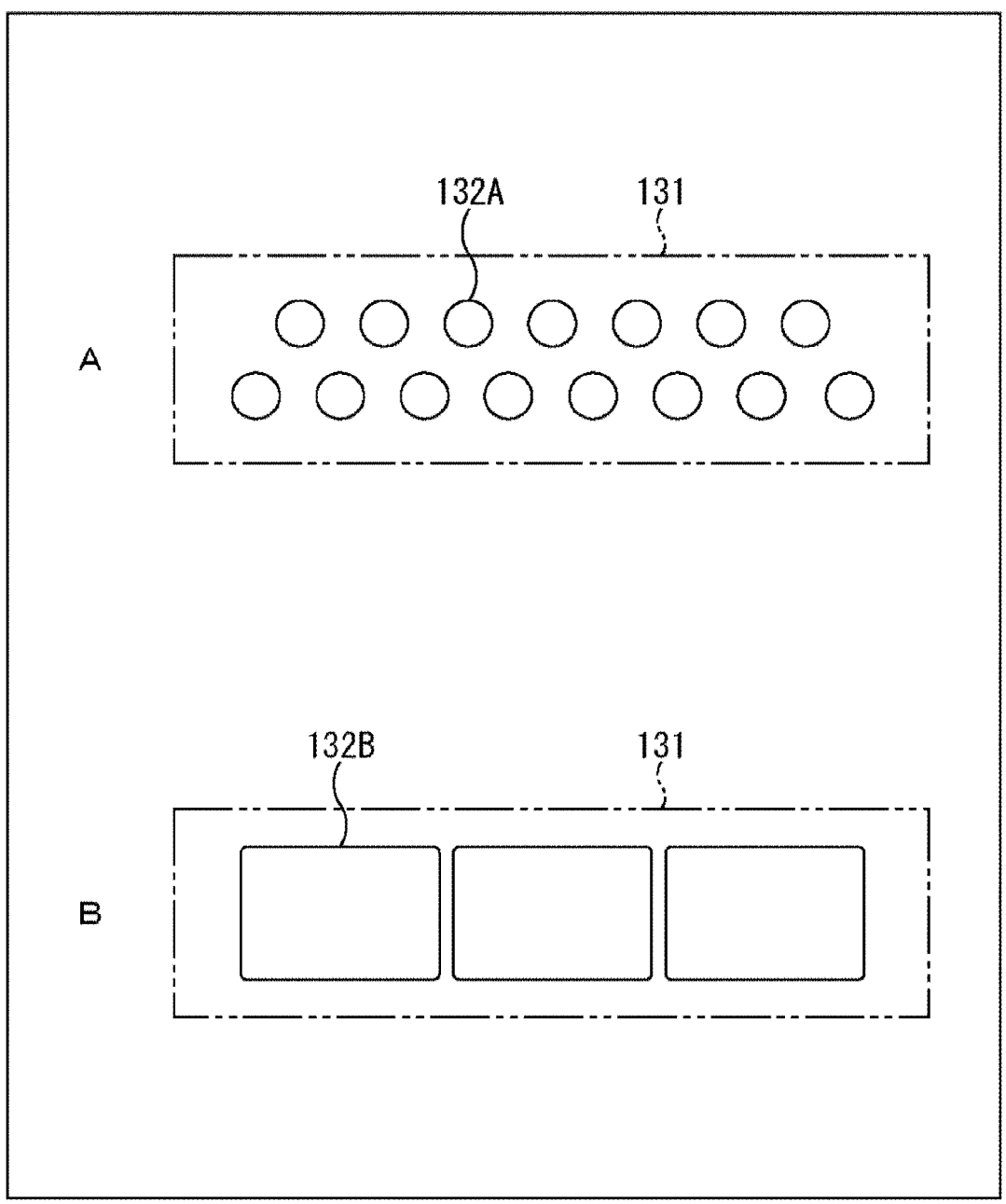
FIG. 28 is a diagram showing variations of a planar shape of the pad opening.

As shown in A of FIG. 28, it is possible to form a pad opening 132A such that a planar shape thereof is circular and an opening is formed in a circular shape in a planar view, and to chamfer a corner portion of a step. A fracture of the sealing resin 14 can also be prevented by the pad opening 132A having such a shape.

As shown in B of FIG. 28, it is possible to provide a pad opening 132B formed with a large shape so as to reduce the number of openings, and to chamfer a corner portion at a step. A fracture of the sealing resin 14 can also be prevented by the pad opening 132B having such a shape.

A variation of a part in the vicinity of the pad opening 132 will be described with reference to FIG. 29.

Figure 29:
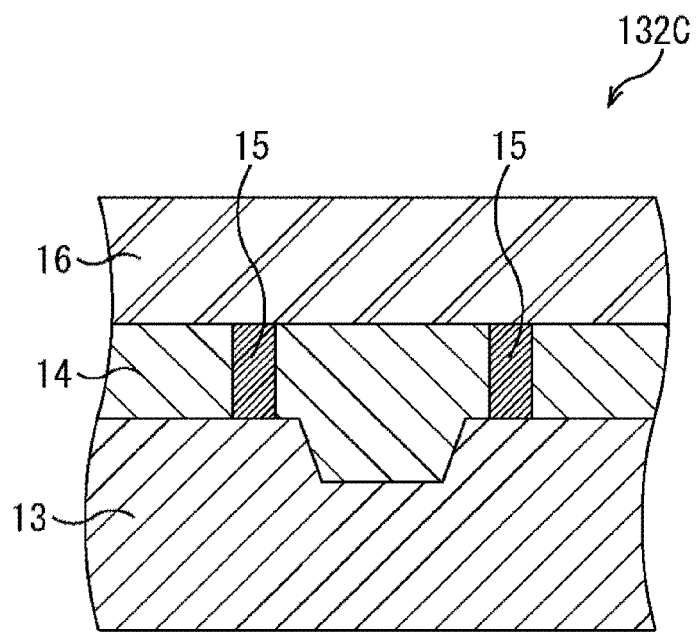
FIG. 29 is a diagram showing a variation of a part in the vicinity of the pad opening.

As shown in FIG. 29, a reinforcing resin 15 is formed in a manner to surround a pad opening 132C, so that it is possible to separate a sealing resin 14 having filled the pad opening 132O and formed in the vicinity thereof from the sealing resin 14 formed in the other area. As a result, even if a fracture of the sealing resin 14 is caused by, for example, concentration of stress on a stepped portion of the pad opening 132C, it is possible to avoid an extension of the fracture of the sealing resin 14 to another area with the reinforcing resin 15 surrounding the pad opening 132O.

Note that it is also possible to separate the pad opening 132C from surroundings by providing an air gap instead of the reinforcing resin 15, or by providing both the reinforcing resin 15 and the air gap.

Note that the imaging device 11 as described above is applicable to various electronic apparatuses. Examples of the various electronic apparatuses include an image pickup system such as a digital still camera and a digital video camera, a mobile phone having an imaging function, and other apparatuses having an imaging function.

<Configuration Example of Image Pickup Apparatus>

Figure 30:
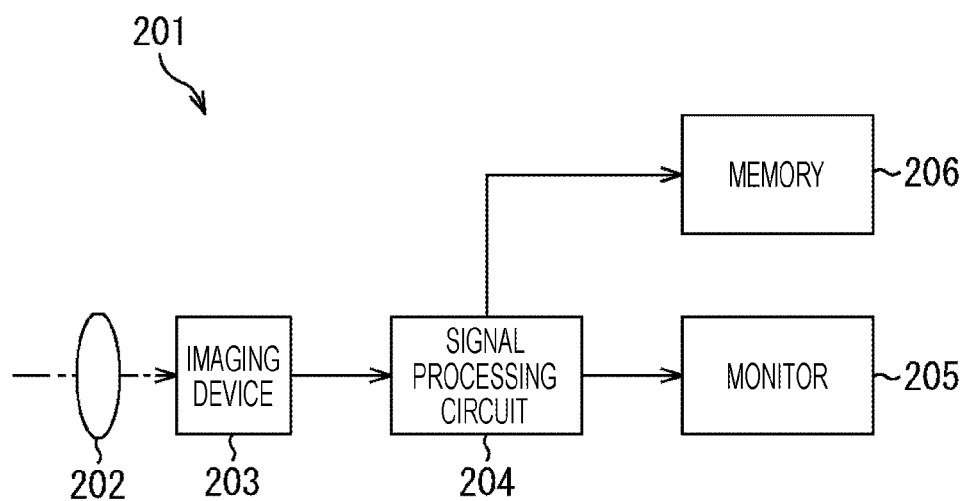
FIG. 30 is a block diagram showing a configuration example of an image pickup apparatus.

FIG. 30 is a block diagram showing a configuration example of an image pickup apparatus to be mounted on an electronic apparatus.

As shown in FIG. 9, an image pickup apparatus 201 includes an optical system 202, an imaging device 203, a signal processing circuit 204, a monitor 205, and a memory 206. The image pickup apparatus 201 is capable of taking still images and moving images.

The optical system 202 includes one or a plurality of lenses, and guides image light (incident light) from an object to the imaging device 203 to cause an image to be formed on a light receiving surface (sensor unit) of the imaging device 203.

As the imaging device 203, the imaging device 11 described above is applied. Electrons are accumulated in the imaging device 203 for a certain period of time according to the image formed on the light receiving surface via the optical system 202. Then, signals corresponding to the electrons accumulated in the imaging device 203 are supplied to the signal processing circuit 204.

The signal processing circuit 204 performs various signal processing on the pixel signals output from the imaging device 203. An image (image data) obtained through the signal processing performed by the signal processing circuit 204 is supplied to the monitor 205 to be displayed, or supplied to the memory 206 to be stored (recorded).

In the image pickup apparatus 201 configured as described above, it is possible to perform better imaging by applying the imaging device 11 described above, as a result of, for example, an improvement in characteristics of the imaging device 11.

<Example of Using Image Sensor>

Figure 31:
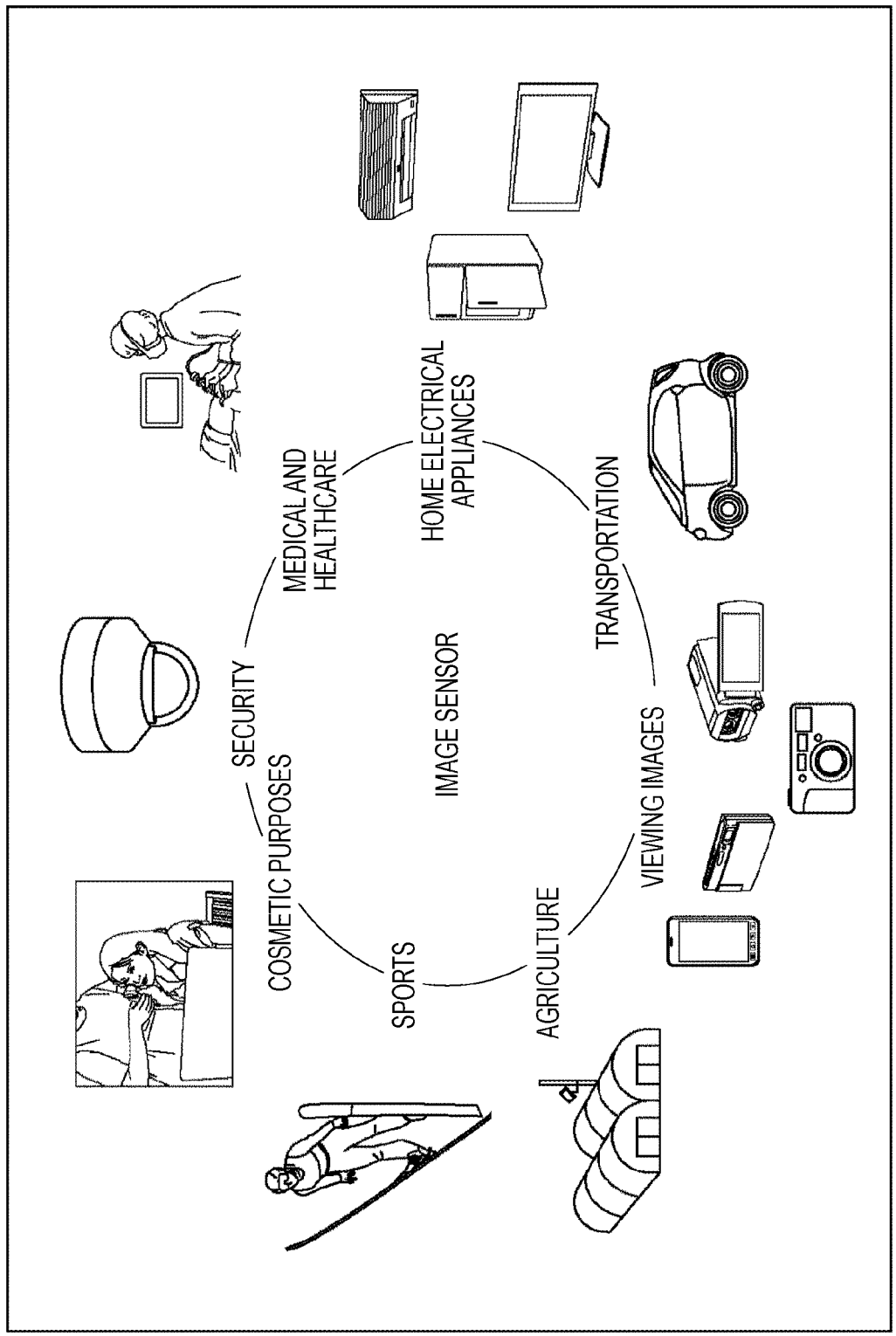
FIG. 31 is a diagram showing examples of using an image sensor.

FIG. 31 is a diagram showing examples of using the above-described image sensor.

For example, the above-described image sensor (imaging device 11) can be used in various cases for sensing light such as visible light, infrared light, ultraviolet light, and X-rays, as described below.

An apparatus for taking images to be provided for viewing, such as a digital camera and a portable appliance with a camera function.

An apparatus to be used for transportation, such as an in-vehicle sensor for photographing the front, rear, surroundings, inside, and others of an automobile for the purpose of, for example, safe driving including an automatic stop and the like, and recognition of a driver's condition, a surveillance camera for monitoring running vehicles and roads, and a distance measuring sensor for measuring a distance between vehicles or the like.

An apparatus to be used for home electrical appliances such as a TV set, a refrigerator, and an air conditioner, so as to take images of a user's gestures and operate the appliances according to the gestures.

An apparatus to be used for medical and healthcare, such as an endoscope and an apparatus for performing angiography by receiving infrared light.

An apparatus to be used for security, such as a surveillance camera for crime-prevention purposes and a camera for person authentication.

An apparatus to be used for cosmetic purposes, such as a skin measuring instrument for photographing skin and a microscope for photographing a scalp.

An apparatus to be used for sports, such as an action camera and a wearable camera for sports use and the like.

An apparatus to be used for agriculture, such as a camera for monitoring the condition of fields and crops.

Note that the present technology can also adopt the following configurations.

(1)

An imaging device including:

a sensor substrate provided with an effective pixel area in which a plurality of pixels is arranged in an array;

a transparent sealing member that seals a surface of the sensor substrate on the effective pixel area side;

a first adhesive member that bonds the sensor substrate and the sealing member in an area including at least the effective pixel area; and a second adhesive member that bonds the sensor substrate and the sealing member in an outer peripheral region located outside the effective pixel area in a planar view, and has higher rigidity than the first adhesive member, in which a product of adhesive strength per unit area of the first adhesive member and the second adhesive member in the outer peripheral region and an area of a part bonded in the outer peripheral region is set to be larger than a product of adhesive strength per unit area of the first adhesive member in the effective pixel area and an area of a part bonded in the effective pixel area.

(2)

The imaging device according to (1) above, in which the second adhesive member is disposed in an area including chip edges of the imaging device, in the outer peripheral region, and is formed with a discontinuous part in a planar view of the Imaging device.

(3)

The imaging device according to (1) or (2) above, in which the second adhesive member is formed in at least two positions along two opposed sides in a planar view of the imaging device.

(4)

The imaging device according to (1) or (2) above, in which the second adhesive member is formed in a plurality of positions in a scattered manner along an outer periphery of the chip edges in a planar view of the imaging device.

(5)

The imaging device according to (1) above, in which the second adhesive member is disposed in an area including no chip edge of the imaging device, in the outer peripheral region.

(6)

The imaging device according to (5) above, in which the second adhesive member is formed with a discontinuous part in a planar view of the Imaging device.

(7)

The imaging device according to (5) or (6) above, in which the second adhesive member is formed inside the chip edges of the imaging device along two opposed sides in a planar view of the imaging device.

(8)

The imaging device according to (5) above, in which the second adhesive member is continuously formed in a manner to surround the effective pixel area side inside the chip edges of the imaging device in a planar view of the imaging device.

(9)

The imaging device according to (5) or (6) above, in which the second adhesive member is formed in a plurality of positions in a scattered manner along an outer periphery of the imaging device, inside the chip edges of the imaging device in a planar view of the imaging device.

(10)

The imaging device according to any one of (1) to (9) above, in which an excavated portion is provided in the outer peripheral region of at least one of the sensor substrate or the sealing member, and the first adhesive member is embedded in the excavated portion.

(11)

The imaging device according to any one of (1) to (10) above, in which a recess is formed in a central region of the sensor substrate, in which the effective pixel area is provided, and the sensor substrate and the sealing member are stacked in layers such that a protruded portion of the sealing member is fitted in the recess via the first adhesive member, the protruded portion being formed in a protruded shape in accordance with a shape of the recess.

(12)

The imaging device according to (11) above, in which an anchoring member is formed in a manner to extend from the sensor substrate side to the sealing member in the outer peripheral region of the sensor substrate.

(13)

The imaging device according to any one of (1) to (12) above, in which a pad opening for opening a pad is formed in the outer peripheral region of the sensor substrate, and a thin film is formed in the pad opening.

(14)

The imaging device according to any one of (1) to (12) above, in which a pad opening for opening a pad is formed in the outer peripheral region of the sensor substrate such that the pad opening is opened with multiple steps.

(15)

The imaging device according to any one of (1) to (12) above, in which a pad opening for opening a pad is formed in the outer peripheral region of the sensor substrate, with a structure for avoiding formation of a step on the first adhesive member at a stepped portion of the pad opening.

(16)

A method of manufacturing an imaging device that includes:

a sensor substrate provided with an effective pixel area in which a plurality of pixels is arranged in an array;

a transparent sealing member that seals a surface of the sensor substrate on the effective pixel area side;

a first adhesive member that bonds the sensor substrate and the sealing member in an area including at least the effective pixel area; and a second adhesive member that bonds the sensor substrate and the sealing member in an outer peripheral region located outside the effective pixel area in a planar view, and has higher rigidity than the first adhesive member, in which a product of adhesive strength per unit area of the first adhesive member and the second adhesive member in the outer peripheral region and an area of a part bonded in the outer peripheral region is set to be larger than a product of adhesive strength per unit area of the first adhesive member in the effective pixel area and an area of a part bonded in the effective pixel area, the method including:

forming the second adhesive member with a discontinuous part in the outer peripheral region of either the sensor substrate or the sealing member;

forming the first adhesive member on an entire surface except an area in which the second adhesive member has been formed; and bonding the sensor substrate and the sealing member with the first adhesive member and the second adhesive member.

(17)

A method of manufacturing an imaging device that includes:

a sensor substrate provided with an effective pixel area in which a plurality of pixels is arranged in an array;

a transparent sealing member that seals a surface of the sensor substrate on the effective pixel area side;

a first adhesive member that bonds the sensor substrate and the sealing member in an area including at least the effective pixel area; and a second adhesive member that bonds the sensor substrate and the sealing member in an outer peripheral region located outside the effective pixel area in a planar view, and has higher rigidity than the first adhesive member, in which a product of adhesive strength per unit area of the first adhesive member and the second adhesive member in the outer peripheral region and an area of a part bonded in the outer peripheral region is set to be larger than a product of adhesive strength per unit area of the first adhesive member in the effective pixel area and an area of a part bonded in the effective pixel area, the method including:

forming the second adhesive member, at a wafer level before the imaging device is divided into individual pieces, such that the second adhesive member is disposed in the outer peripheral region except portions at which chip edges of the imaging device are to be formed;

forming the first adhesive member on an entire surface except an area in which the second adhesive member has been formed;

bonding the sensor substrate and the sealing member with the first adhesive member and the second adhesive member; and performing dicing at the portions at which chip edges of the imaging device are to be formed.

(18)

An electronic apparatus including an imaging device that includes:

a sensor substrate provided with an effective pixel area in which a plurality of pixels is arranged in an array;

a transparent sealing member that seals a surface of the sensor substrate on the effective pixel area side;

a first adhesive member that bonds the sensor substrate and the sealing member in an area including at least the effective pixel area; and a second adhesive member that bonds the sensor substrate and the sealing member in an outer peripheral region located outside the effective pixel area in a planar view, and has higher rigidity than the first adhesive member, in which a product of adhesive strength per unit area of the first adhesive member and the second adhesive member in the outer peripheral region and an area of a part bonded in the outer peripheral region is set to be larger than a product of adhesive strength per unit area of the first adhesive member in the effective pixel area and an area of a part bonded in the effective pixel area.

Note that the present embodiment is not limited to the above-described embodiments, and various modifications can be made without departing from the gist of the present disclosure.

REFERENCE SIGNS LIST

11 Imaging device
12 Supporting substrate
13 Sensor substrate
14 Sealing resin
15 Reinforcing resin
16 Sealing glass
17 Effective pixel area

What is claimed is:

1. An imaging device comprising:
a sensor substrate provided with an effective pixel area in which a plurality of pixels is arranged in an array;
a transparent sealing member that seals a surface of the sensor substrate on the effective pixel area side;
a first adhesive member that bonds the sensor substrate and the sealing member in an area including at least the effective pixel area; and
a second adhesive member that bonds the sensor substrate and the sealing member in an outer peripheral region located outside the effective pixel area in a planar view, and has higher rigidity than the first adhesive member,
wherein a product of adhesive strength per unit area of the first adhesive member and the second adhesive member in the outer peripheral region and an area of a part bonded in the outer peripheral region is set to be larger than a product of adhesive strength per unit area of the first adhesive member in the effective pixel area and an area of a part bonded in the effective pixel area.

2. The imaging device according to claim 1, wherein the second adhesive member is disposed in an area including chip edges of the imaging device, in the outer peripheral region, and is formed with a discontinuous part in a planar view of the Imaging device.

3. The imaging device according to claim 2, wherein the second adhesive member is formed in at least two positions along two opposed sides in a planar view of the imaging device.

4. The imaging device according to claim 2, wherein the second adhesive member is formed in a plurality of positions in a scattered manner along an outer periphery of the chip edges in a planar view of the imaging device.

5. The imaging device according to claim 1, wherein the second adhesive member is disposed in an area including no chip edge of the imaging device, in the outer peripheral region.

6. The imaging device according to claim 5, wherein the second adhesive member is formed with a discontinuous part in a planar view of the Imaging device.

7. The imaging device according to claim 6, wherein the second adhesive member is formed inside the chip edges of the imaging device along two opposed sides in a planar view of the imaging device.

8. The imaging device according to claim 5, wherein the second adhesive member is continuously formed in a manner to surround the effective pixel area side inside the chip edges of the imaging device in a planar view of the imaging device.

9. The imaging device according to claim 6, wherein the second adhesive member is formed in a plurality of positions in a scattered manner along an outer periphery of the imaging device, inside the chip edges of the imaging device in a planar view of the imaging device.

10. The imaging device according to claim 1, wherein an excavated portion is provided in the outer peripheral region of at least one of the sensor substrate or the sealing member, and
the first adhesive member is embedded in the excavated portion.

11. The imaging device according to claim 1, wherein a recess is formed in a central region of the sensor substrate, in which the effective pixel area is provided, and
the sensor substrate and the sealing member are stacked in layers such that a protruded portion of the sealing member is fitted in the recess via the first adhesive member, the protruded portion being formed in a protruded shape in accordance with a shape of the recess.

12. The imaging device according to claim 11, wherein an anchoring member is formed in a manner to extend from the sensor substrate side to the sealing member in the outer peripheral region of the sensor substrate.

13. The imaging device according to claim 1, wherein a pad opening for opening a pad is formed in the outer peripheral region of the sensor substrate, and
a thin film is formed in the pad opening.

14. The imaging device according to claim 1, wherein a pad opening for opening a pad is formed in the outer peripheral region of the sensor substrate such that the pad opening is opened with multiple steps.

15. The imaging device according to claim 1, wherein a pad opening for opening a pad is formed in the outer peripheral region of the sensor substrate, with a structure for avoiding formation of a step on the first adhesive member at a stepped portion of the pad opening.

16. A method of manufacturing an imaging device that includes:
a sensor substrate provided with an effective pixel area in which a plurality of pixels is arranged in an array;
a transparent sealing member that seals a surface of the sensor substrate on the effective pixel area side;
a first adhesive member that bonds the sensor substrate and the sealing member in an area including at least the effective pixel area; and
a second adhesive member that bonds the sensor substrate and the sealing member in an outer peripheral region located outside the effective pixel area in a planar view, and has higher rigidity than the first adhesive member,
wherein a product of adhesive strength per unit area of the first adhesive member and the second adhesive member in the outer peripheral region and an area of a part bonded in the outer peripheral region is set to be larger than a product of adhesive strength per unit area of the first adhesive member in the effective pixel area and an area of a part bonded in the effective pixel area, the method comprising:
forming the second adhesive member with a discontinuous part in the outer peripheral region of either the sensor substrate or the sealing member;

forming the first adhesive member on an entire surface except an area in which the second adhesive member has been formed; and bonding the sensor substrate and the sealing member with the first adhesive member and the second adhesive member.

17. A method of manufacturing an imaging device that includes:

a sensor substrate provided with an effective pixel area in which a plurality of pixels is arranged in an array;

a transparent sealing member that seals a surface of the sensor substrate on the effective pixel area side;

a first adhesive member that bonds the sensor substrate and the sealing member in an area including at least the effective pixel area; and a second adhesive member that bonds the sensor substrate and the sealing member in an outer peripheral region located outside the effective pixel area in a planar view, and has higher rigidity than the first adhesive member, wherein a product of adhesive strength per unit area of the first adhesive member and the second adhesive member in the outer peripheral region and an area of a part bonded in the outer peripheral region is set to be larger than a product of adhesive strength per unit area of the first adhesive member in the effective pixel area and an area of a part bonded in the effective pixel area, the method comprising:

forming the second adhesive member, at a wafer level before the imaging device is divided into individual pieces, such that the second adhesive member is disposed in the outer peripheral region except portions at which chip edges of the imaging device are to be formed;

forming the first adhesive member on an entire surface except an area in which the second adhesive member has been formed;

bonding the sensor substrate and the sealing member with the first adhesive member and the second adhesive member; and performing dicing at the portions at which chip edges of the imaging device are to be formed.

18. An electronic apparatus comprising an imaging device that includes:

a sensor substrate provided with an effective pixel area in which a plurality of pixels is arranged in an array;

a transparent sealing member that seals a surface of the sensor substrate on the effective pixel area side;

a first adhesive member that bonds the sensor substrate and the sealing member in an area including at least the effective pixel area; and a second adhesive member that bonds the sensor substrate and the sealing member in an outer peripheral region located outside the effective pixel area in a planar view, and has higher rigidity than the first adhesive member, wherein a product of adhesive strength per unit area of the first adhesive member and the second adhesive member in the outer peripheral region and an area of a part bonded in the outer peripheral region is set to be larger than a product of adhesive strength per unit area of the first adhesive member in the effective pixel area and an area of a part bonded in the effective pixel area.

* * * * *